US012609164B2

(12) United States Patent
You

(10) Patent No.: US 12,609,164 B2
(45) Date of Patent: Apr. 21, 2026

(54) MANAGING PROGRAM DISTURB IN MEMORY DEVICES

(71) Applicant: Yangtze Memory Technologies Co., Ltd., Wuhan (CN)

(72) Inventor: Kaikai You, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 278 days.

(21) Appl. No.: 18/462,226

(22) Filed: Sep. 6, 2023

(65) Prior Publication Data

US 2025/0078931 A1    Mar. 6, 2025

(30) Foreign Application Priority Data

Aug. 28, 2023    (CN) .......................... 202311095166.1

(51) Int. Cl.
| | |
|---|---|
| *G11C 16/10* | (2006.01) |
| *G11C 16/04* | (2006.01) |
| *G11C 16/08* | (2006.01) |
| *G11C 16/28* | (2006.01) |
| *G11C 16/32* | (2006.01) |
| *G11C 16/34* | (2006.01) |

(52) U.S. Cl.
CPC ........ G11C 16/102 (2013.01); G11C 16/0483 (2013.01); G11C 16/08 (2013.01); G11C 16/10 (2013.01); G11C 16/28 (2013.01); G11C 16/32 (2013.01); G11C 16/3459 (2013.01)

(58) Field of Classification Search
CPC ... G11C 16/102; G11C 16/0483; G11C 16/08; G11C 16/28; G11C 16/32; G11C 11/5628; G11C 16/10; G11C 16/3459; G11C 16/3422
See application file for complete search history.

(56) References Cited

U.S. PATENT DOCUMENTS

| | | | |
|---|---|---|---|
| 10,269,435 B1 | 4/2019 | Chen et al. | |
| 10,790,003 B1 * | 9/2020 | Chen | G11C 11/40626 |
| 10,957,394 B1 * | 3/2021 | Chen | G11C 16/10 |
| 11,222,674 B2 * | 1/2022 | Li | G11C 16/06 |

(Continued)

FOREIGN PATENT DOCUMENTS

| | | |
|---|---|---|
| CN | 113544781 A | 10/2021 |
| CN | 116110465 A | 5/2023 |

OTHER PUBLICATIONS

Office Action in Chinese Appln. No. 202311095166.1, mailed on Aug. 29, 2025, 22 pages (with English translation).

*Primary Examiner* — Amir Zarabian
*Assistant Examiner* — Justin Bryce Heisterkamp
(74) *Attorney, Agent, or Firm* — Fish & Richardson P.C.

(57) ABSTRACT

Example memory devices, memory systems, and methods for reducing program disturb in NAND flash memory are disclosed. One example method includes applying, at a first time and during a channel preparation period of a program operation of a first memory cell in a memory cell array, a first voltage to a first word line coupled to the first memory cell. A second voltage is applied to the first word line at a second time after the first time and during the channel preparation period, where the second voltage is lower than the first voltage. A programming voltage is applied to the first word line after the channel preparation period and during the program operation of the first memory cell.

20 Claims, 34 Drawing Sheets

(56)        References Cited

U.S. PATENT DOCUMENTS

| | | | |
|---|---|---|---|
| 2014/0211563 A1 | 7/2014 | Chang et al. | |
| 2019/0355408 A1* | 11/2019 | Shin | G11C 11/4093 |
| 2019/0378579 A1* | 12/2019 | Zhao | G11C 16/3459 |
| 2019/0378580 A1* | 12/2019 | Zhao | G11C 7/02 |
| 2019/0378581 A1* | 12/2019 | Zhao | G11C 16/0483 |
| 2020/0168276 A1* | 5/2020 | Yang | G11C 16/3427 |
| 2022/0036953 A1* | 2/2022 | Joe | G11C 16/26 |
| 2022/0059167 A1* | 2/2022 | Shin | G11C 16/10 |
| 2022/0189555 A1* | 6/2022 | Diep | G11C 16/3427 |
| 2022/0215888 A1* | 7/2022 | Song | G11C 16/24 |
| 2022/0359021 A1* | 11/2022 | Jia | G11C 16/3427 |
| 2023/0015493 A1* | 1/2023 | Jung | G11C 16/10 |
| 2023/0145681 A1* | 5/2023 | Joe | G11C 16/12 |
| | | | 365/189.011 |
| 2023/0162798 A1* | 5/2023 | Li | G11C 16/32 |
| | | | 365/189.011 |
| 2023/0393759 A1* | 12/2023 | Jeong | G11C 29/50004 |
| 2024/0161834 A1* | 5/2024 | Heo | G11C 16/08 |

* cited by examiner

400 deck2 deck1 deck0

PGM

IDPDMY
deck1

IDPDMY
deck0

BL

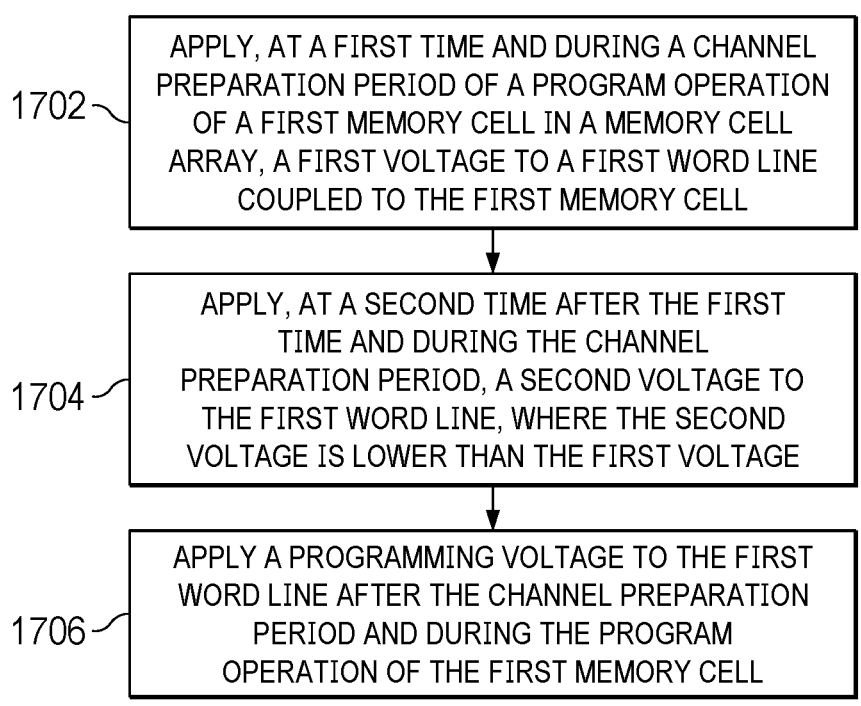

1702 — APPLY, AT A FIRST TIME AND DURING A CHANNEL PREPARATION PERIOD OF A PROGRAM OPERATION OF A FIRST MEMORY CELL IN A MEMORY CELL ARRAY, A FIRST VOLTAGE TO A FIRST WORD LINE COUPLED TO THE FIRST MEMORY CELL

1704 — APPLY, AT A SECOND TIME AFTER THE FIRST TIME AND DURING THE CHANNEL PREPARATION PERIOD, A SECOND VOLTAGE TO THE FIRST WORD LINE, WHERE THE SECOND VOLTAGE IS LOWER THAN THE FIRST VOLTAGE

1706 — APPLY A PROGRAMMING VOLTAGE TO THE FIRST WORD LINE AFTER THE CHANNEL PREPARATION PERIOD AND DURING THE PROGRAM OPERATION OF THE FIRST MEMORY CELL

FIG. 17

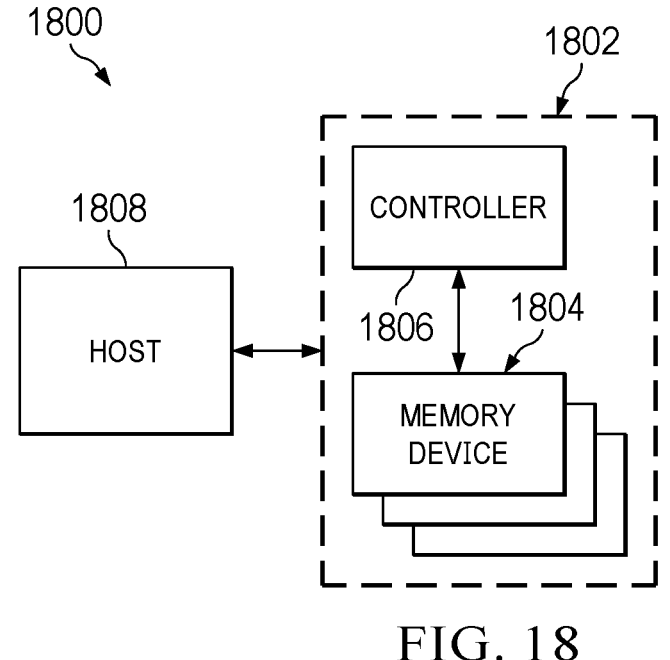

1800

1802

1808

CONTROLLER

HOST 1806   1804

MEMORY DEVICE

MANAGING PROGRAM DISTURB IN MEMORY DEVICES

CROSS-REFERENCE TO RELATED APPLICATIONS

This application claims priority to Chinese Patent Application No. 202311095166.1, filed on Aug. 28, 2023, which is hereby incorporated by reference in its entirety.

TECHNICAL FIELD

The present disclosure relates to memory devices, memory systems, and methods for reducing program disturb in a flash memory.

BACKGROUND

Flash memory is a low-cost, high-density, nonvolatile solid-state storage medium that can be electrically erased and reprogrammed. Flash memory includes NOR flash memory and NAND flash memory. Various operations can be performed by a flash memory, for example, program (write) and erase operations, to change the threshold voltage of each memory cell to a respective level. For NAND flash memory, an erase operation can be performed at the block level, a program operation can be performed at the page level, and a read operation can be performed at the page level.

SUMMARY

The present disclosure relates to memory devices, memory systems, and methods for reducing program disturb in NAND flash memory. One example method includes applying, at a first time and during a channel preparation period of a program operation of a first memory cell in a memory cell array, a first voltage to a first word line coupled to the first memory cell. A second voltage is applied to the first word line at a second time after the first time and during the channel preparation period, where the second voltage is lower than the first voltage. A programming voltage is applied to the first word line after the channel preparation period and during the program operation of the first memory cell.

While generally described as computer-implemented software embodied on tangible media that processes and transforms the respective data, some or all of the aspects may be computer-implemented methods or further included in respective systems or other devices for performing this described functionality. The details of these and other aspects and implementations of the present disclosure are set forth in the accompanying drawings and the description below. Other features, objects, and advantages of the disclosure will be apparent from the description and drawings, and from the claims.

BRIEF DESCRIPTION OF DRAWINGS

FIG. 17 illustrates an example of a flow chart of a method for reducing program disturb in a memory device, according to some aspects of the present disclosure.

FIG. 18 illustrates a block diagram of an example system having a memory device, according to some aspects of the present disclosure.

Like reference numbers and designations in the various drawings indicate like elements.

DETAILED DESCRIPTION

This specification relates to memory devices, memory systems, methods, and media for reducing program disturb in NAND flash memory. In some cases, program disturb can be caused by hot carrier injection (HCI), where electrons are injected into memory cells that are not selected for programming and are coupled to a word line (WLn) connected to a memory cell selected for programming. The HCI can increase the threshold voltages of the unselected memory cells so as to cause program disturb. The HCI can be due to large differences in channel potentials between memory cells coupled to WLn and memory cells coupled to WLn−1 that immediately proceeds WLn in a programming order of word lines, when a program voltage is applied to WLn.

In some cases, the HCI issue described above exists during channel preparation period that proceeds a period for programming of a memory cell, especially for NAND flash memory with reduced ratio of gate length to inter-gate space (Lg/Ls), or increased number of programming pulses. To reduce HCI-induced program disturb during the channel preparation period, bias voltages can be applied to specific word lines during the channel preparation period, without affecting channel potentials during the programming period.

Figure 1:
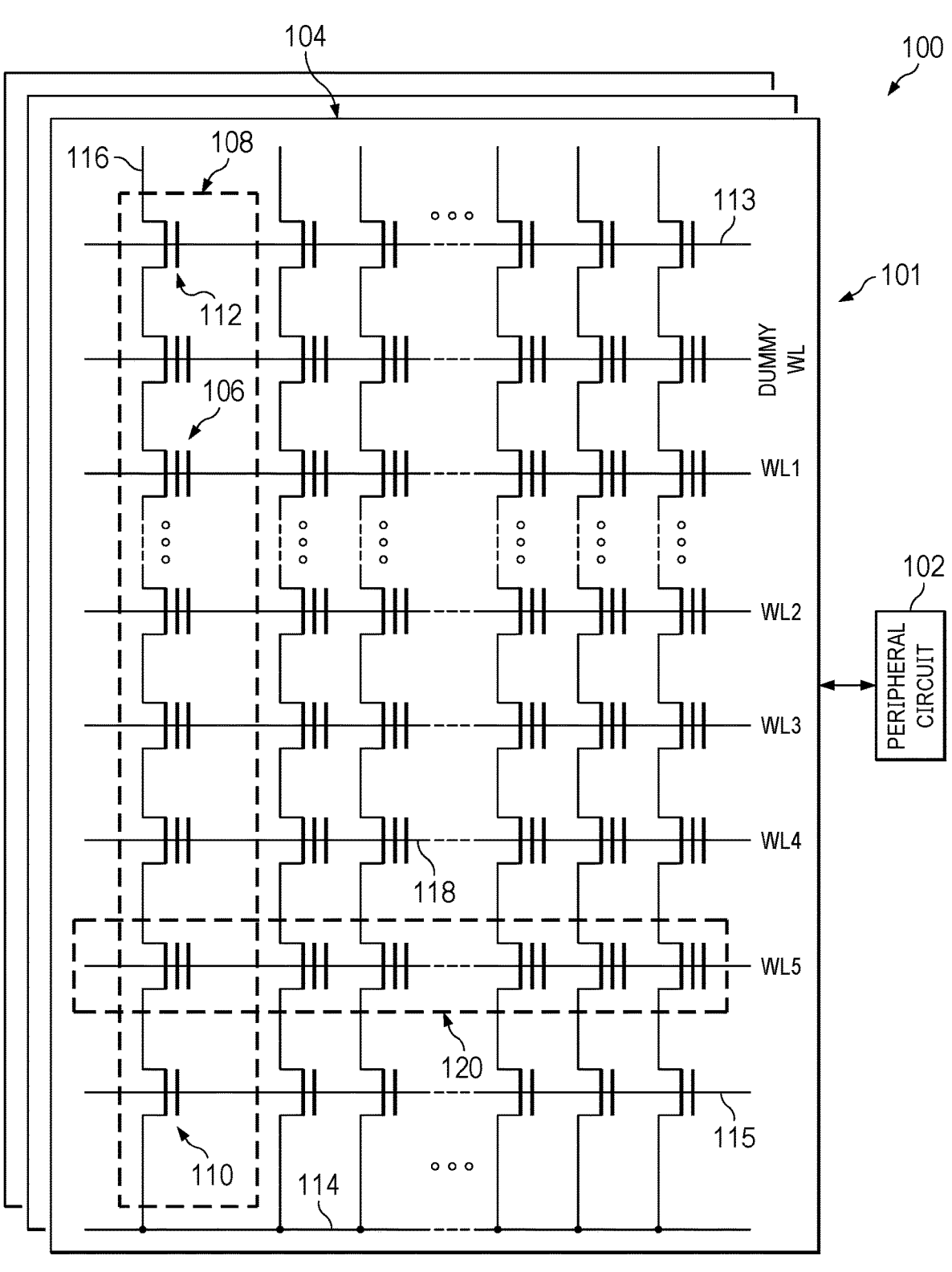
FIG. 1 illustrates an example of a schematic diagram of a memory device including peripheral circuits, according to some aspects of the present disclosure.

FIG. 1 illustrates an example of a schematic circuit diagram of a memory device 100 including peripheral circuits, according to some aspects of the present disclosure. Memory device 100 can include a memory cell array 101 and peripheral circuits 102 coupled to memory cell array 101. Memory cell array 101 can be a NAND Flash memory cell array in which memory cells 106 are provided in the form of an array of NAND memory strings 108 each extending vertically above a substrate (not shown). In some implementations, each NAND memory string 108 includes a plurality of memory cells 106 coupled in series and stacked vertically. Each memory cell 106 can hold a continuous, analog value, such as an electrical voltage or charge that depends on the number of electrons trapped within a region of memory cell 106. Each memory cell 106 can be either a floating gate type of memory cell including a floating-gate transistor or a charge trap type of memory cell including a charge-trap transistor.

In some implementations, each memory cell 106 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 106 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 1 each NAND memory string 108 can include a source select gate (SSG) 110 at its source end and a drain select gate (DSG) 112 at its drain end. SSG 110 and DSG 112 can be configured to activate selected NAND memory strings 108 (columns of the array) during read and program operations. In some implementations, the sources of NAND memory strings 108 in the same block 104 are coupled through a same source line (SL) 114, e.g., a common SL. In other words, all NAND memory strings 108 in the same block 104 have an array common source (ACS), according to some implementations. DSG 112 of each NAND memory string 108 is coupled to a respective bit line 116 from which data can be read or written via an output bus (not shown), according to some implementations. In some implementations, each NAND memory string 108 is configured to be selected or deselected by applying a select voltage or a deselect voltage (e.g., 0 V) to respective DSG 112 through one or more DSG lines 113, and/or by applying a select voltage or a deselect voltage (e.g., 0 V) to respective SSG 110 through one or more SSG lines 115.

As shown in FIG. 1, NAND memory strings 108 can be organized into multiple blocks 104, each of which can have a common source line 114, e.g., coupled to the ACS. In some implementations, each block 104 is the basic data unit for erase operations, i.e., all memory cells 106 on the same block 104 are erased at the same time. To erase memory cells 106 in a selected block 104, source lines 114 coupled to selected block 104 as well as unselected blocks 104 in the same plane as selected block 104 can be biased with an erase voltage (Vers), such as a high positive voltage (e.g., 20 V or more). In some examples, erase operation may be performed at a half-block level, a quarter-block level, or a level having any suitable number of blocks or any suitable fractions of a block. Memory cells 106 of adjacent NAND memory strings can be coupled through word lines 118 that select which row of memory cells 106 is affected by read and program operations. Each word line 118 can include a plurality of control gates (gate electrodes) at each memory cell 106 and a gate line coupling the control gates. Example word lines shown in FIG. 1 include dummy WL, WL1, WL2, WL3, WL4, and WL5 that are between one or more DSG lines 113 and one or more SSG lines 115.

Figure 2:
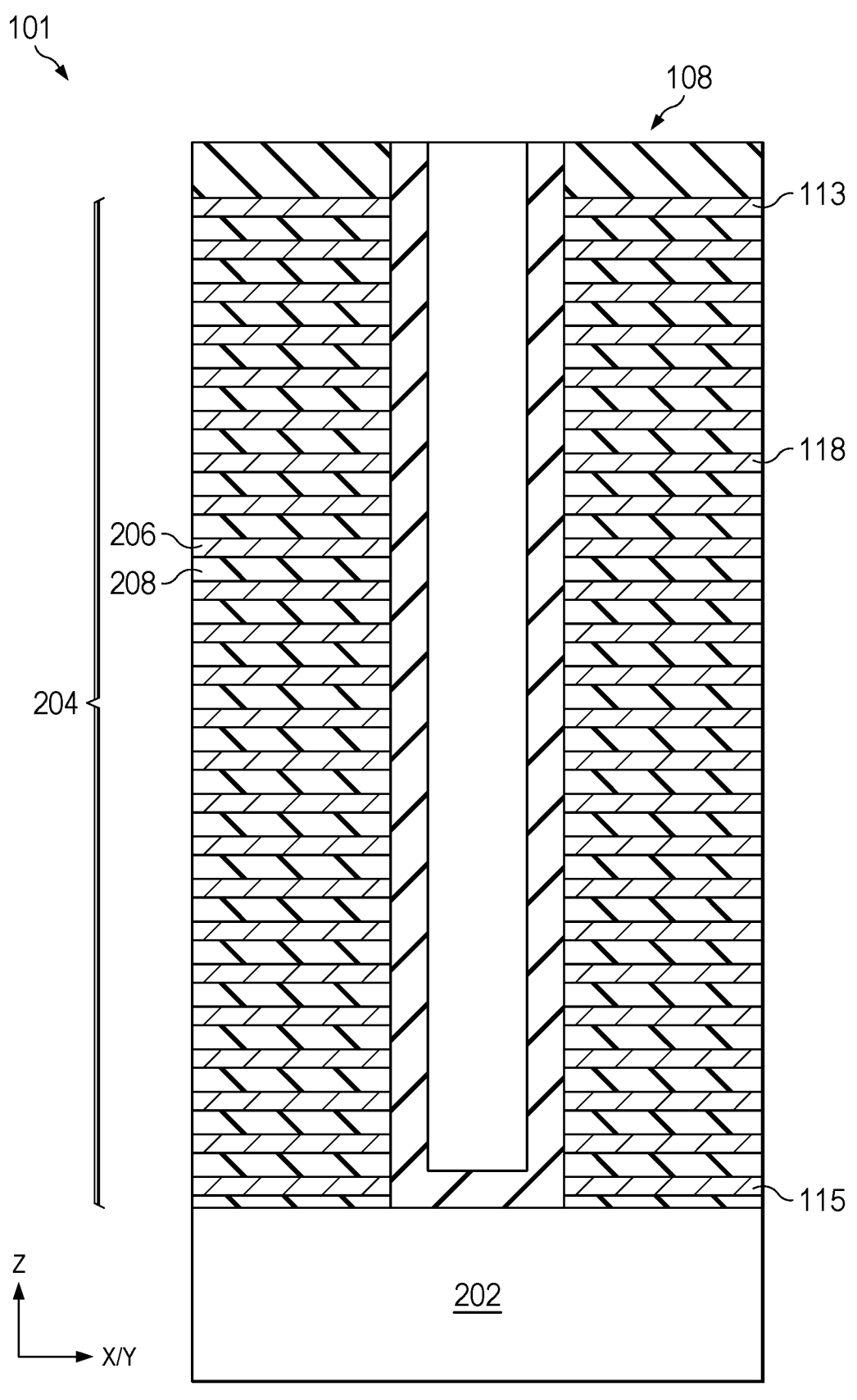
FIG. 2 illustrates an example of a side view of cross-sections of a memory cell array including NAND memory strings, according to some aspects of the present disclosure.

FIG. 2 illustrates an example of a side view of cross-sections of a memory cell array 101 including NAND memory strings 108, according to some aspects of the present disclosure. As shown in FIG. 2, NAND memory string 108 can extend vertically through a memory stack 204 above a substrate 202. Substrate 202 can include silicon (e.g., single crystalline silicon), silicon germanium (SiGe), gallium arsenide (GaAs), germanium (Ge), silicon on insulator (SOI), germanium on insulator (GOI), or any other suitable materials.

Memory stack 204 can include interleaved gate conductive layers 206 and gate-to-gate dielectric layers 208. The number of the pairs of gate conductive layers 206 and gate-to-gate dielectric layers 208 in memory stack 204 can determine the number of memory cells 106 in memory cell array 101. Gate conductive layer 206 can include conductive materials including, but not limited to, tungsten (W), cobalt (Co), copper (Cu), aluminum (Al), polysilicon, doped silicon, silicides, or any combination thereof. In some implementations, each gate conductive layer 206 includes a metal layer, such as a tungsten layer. In some implementations, each gate conductive layer 206 includes a doped polysilicon layer. Each gate conductive layer 206 can include control gates surrounding the memory cells 106, DSG 112, or SSG 110, and can extend laterally as DSG line 113 at the top of memory stack 204, SSG line 115 at the bottom of memory stack 204, or word line 118 between DSG line 113 and SSG line 115.

Figure 3:
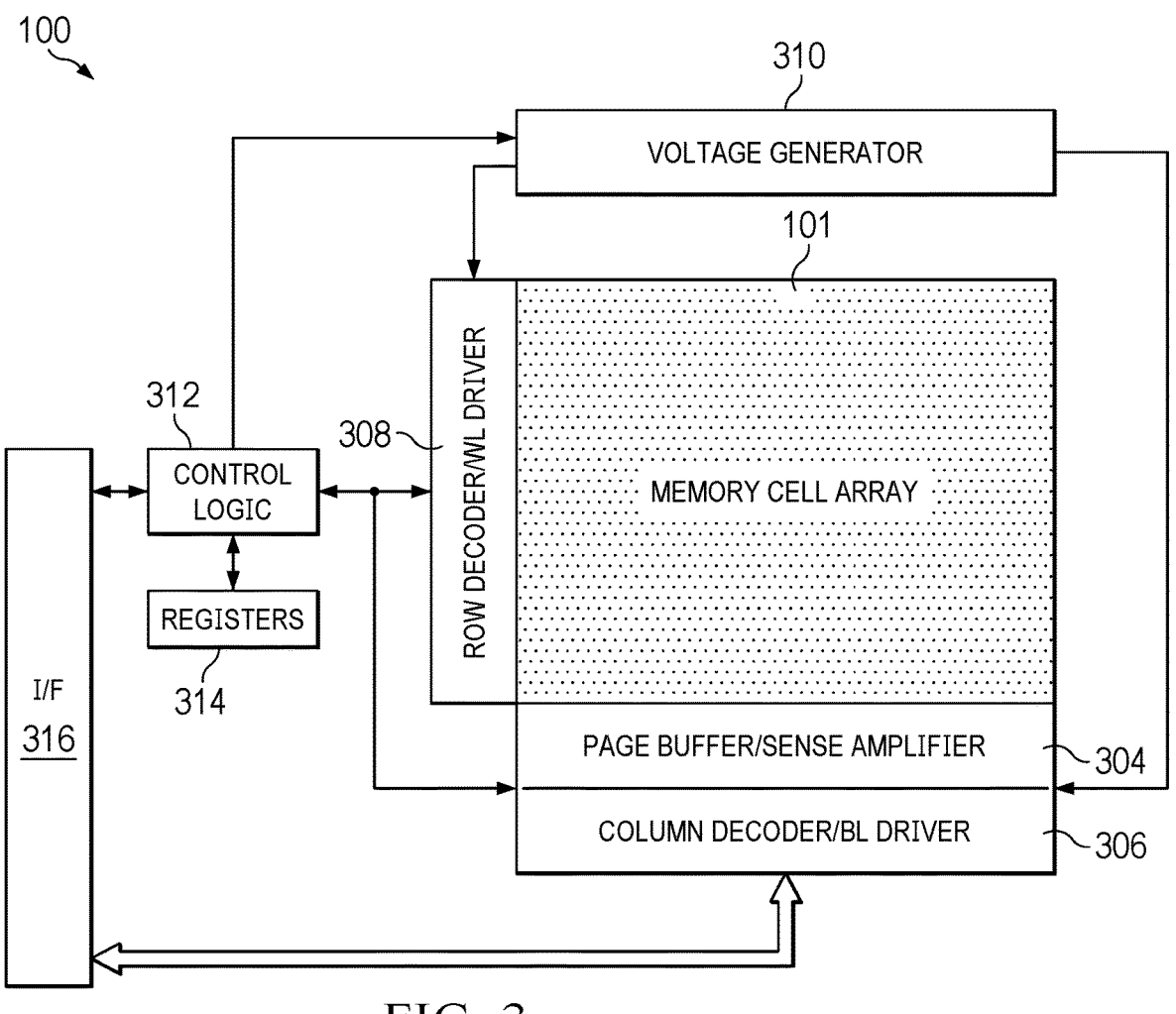
FIG. 3 illustrates some example peripheral circuits, according to some aspects of the present disclosure.

Peripheral circuits 102 can be coupled to memory cell array 101 through bit lines 116, word lines 118, source lines 114, SSG lines 115, and DSG lines 113. Peripheral circuits 102 can include any suitable analog, digital, and mixed-signal circuits for facilitating the operations of memory cell array 101 by applying and sensing voltage signals and/or current signals to and from each target memory cell of the memory cells 106 through bit lines 116, word lines 118, source lines 114, SSG lines 115, and DSG lines 113. Peripheral circuits 102 can include various types of peripheral circuits formed using metal-oxide-semiconductor (MOS) technologies. For example, FIG. 3 illustrates some example peripheral circuits, according to some aspects of the present disclosure. The example peripheral circuits include a page buffer/sense amplifier 304, a column decoder/bit line driver 306, a row decoder/word line driver 308, a voltage generator 310, control logic 312, registers 314, an interface 316, and a data bus. In some examples, additional peripheral circuits not shown in FIG. 3 may be included as well.

Page buffer/sense amplifier 304 can be configured to read and program (write) data from and to memory cell array 101 according to the control signals from control logic 312. In one example, page buffer/sense amplifier 304 may store one page of program data (write data) to be programmed into one page 120 of memory cell array 101. In another example, page buffer/sense amplifier 304 may perform program verify operations to ensure that the data has been properly programmed into memory cells 106 coupled to selected word lines 118. In still another example, page buffer/sense amplifier 304 may also sense the low power signals from bit line 116 that represents a data bit stored in memory cell 106 and amplify the small voltage swing to recognizable logic levels in a read operation. Column decoder/bit line driver 306 can be configured to be controlled by control logic 312 and select one or more NAND memory strings 108 by applying bit line voltages generated from voltage generator 310.

Row decoder/word line driver 308 can be configured to be controlled by control logic 312 and select/deselect blocks 104 of memory cell array 101 and select/deselect word lines 118 of block 104. Row decoder/word line driver 308 can be further configured to drive word lines 118 using word line voltages generated from voltage generator 310. In some implementations, row decoder/word line driver 308 can also select/deselect and drive SSG lines 115 and DSG lines 113 as well. As described below in detail, row decoder/word line driver 308 is configured to apply a read voltage to selected word line 118 in a read operation on memory cell 106 coupled to selected word line 118.

Voltage generator 310 can be configured to be controlled by control logic 312 and generate the word line voltages (e.g., read voltage, program voltage, pass voltage, local voltage, verification voltage, etc.), bit line voltages, and source line voltages to be supplied to memory cell array 101.

Control logic 312 can be coupled to each peripheral circuit described above and configured to control operations of each peripheral circuit. Registers 314 can be coupled to control logic 312 and include status registers, command registers, and address registers for storing status information, command operation codes (OP codes), and command addresses for controlling the operations of each peripheral circuit. As described below in detail, the status registers of registers 314 can include one or more registers configured to store open block information indicative of the open block(s) of all blocks 104 in memory cell array 101, such as having an ADSV list. In some implementations, the open block information is also indicative of the last programmed page of each open block.

Interface 316 can be coupled to control logic 312 and act as a control buffer to buffer and relay control commands received from a host (not shown) to control logic 312 and status information received from control logic 312 to the host. Interface 316 can also be coupled to column decoder/bit line driver 306 via a data bus and act as a data input/output (I/O) interface and a data buffer to buffer and relay the data to and from memory cell array 101.

Figure 4:
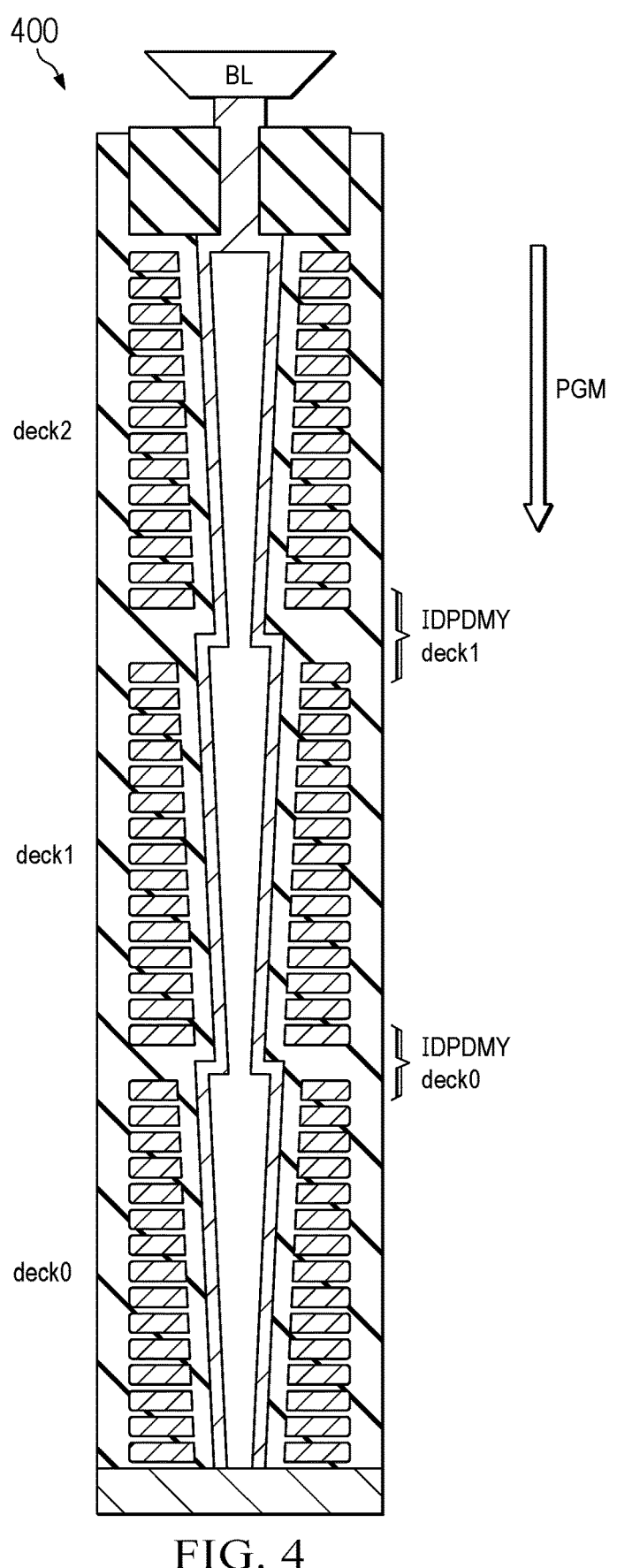
FIG. 4 illustrates an example memory cell stack that includes multiple decks of memory cells, according to some aspects of the present disclosure.

FIG. 4 illustrates an example memory cell stack 400 that includes multiple decks of memory cells, according to some aspects of the present disclosure. Three example decks of memory cells from the top to the bottom of stack 400, i.e., deck2, deck1, and deck0, are shown in FIG. 4. An example of stack 400 is block 104 shown in FIG. 1. Deck2 (e.g., first deck) is positioned above deck1 (e.g., second deck), and deck1 is positioned above deck0. Neighboring decks in FIG. 4 are connected using inter-deck plugs (IDPs). IDPDMY deck1 in FIG. 4 represents dummy word lines (e.g., fifth word line or sixth word line) in deck1 and deck2 that are adjacent to an inter-deck plug (IDP) that connects deck1 and deck2. IDPDMY deck0 in FIG. 4 represents dummy word lines in deck0 and deck1 that are adjacent to an IDP that connects deck0 and deck1. A memory cell (e.g., first memory cell) in deck2 is selected for program operation. The program operation of the memory cell is part of a process of programming memory cells from the top to the bottom of stack 400. Consequently, memory cells positioned above the memory cell in deck2 that is selected for programming have been programmed. The memory cells in stack 400 can be multi-level cells, for example, triple-level cells (TLCs). Referring to FIG. 2, the order of the programming process of memory cells in a memory cell stack from the top to the bottom of the memory cell stack is from the memory cells coupled to the word line further away from substrate 202 to the memory cells coupled to the word line close to substrate 202. Although FIG. 4 illustrates three decks of memory cells, one or more decks of memory cells can be included in stack 400.

Figure 5A:
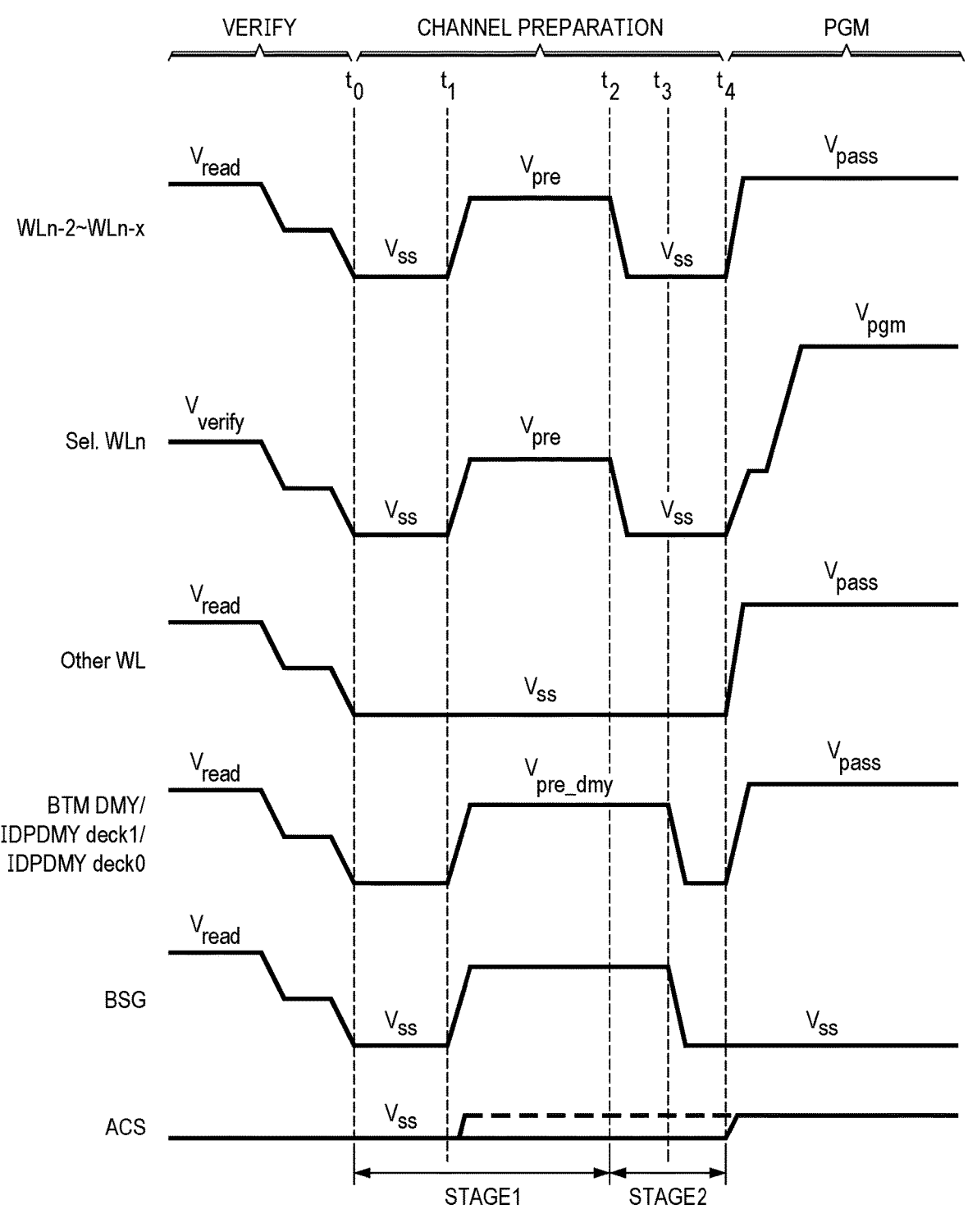
FIG. 5A illustrates an example of voltages of components in the memory cell stack of FIG. 4 during programming of a memory cell in deck2 of FIG. 4, according to some aspects of the present disclosure.

FIG. 5A illustrates an example of voltages of components in stack 400 of FIG. 4 during programming of a memory cell in deck2 of FIG. 4, according to some aspects of the present disclosure. In some implementations, selected WLn represents a word line (e.g., first word line) that is selected for a program operation of a memory cell (e.g., first memory cell) in deck2. Selected WLn can be an example of word line 118 in FIG. 1. WLn–1 to WLn–x represent word lines (e.g., second word line) coupled to memory cells in deck2 of FIG. 4 that have been programmed during the top to bottom programming of stack 400. Example range of x in WLn–x can be 3 to 10. Each of WLn–1 to WLn–x can also be an example of word line 118 in FIG. 1. BSG (e.g., select gate line) represents one or more bottom select gate lines, for example, SSG line 115, that are coupled to one or more select gate transistors, for example, SSG 110 (e.g., source select gate transistor) in FIG. 1, in stack 400. BTM DMY (e.g., fourth word line) represents one or more dummy word lines in deck0 of stack 400 that are close to BSG of stack 400. Other WL (e.g., third word line) represents word lines other than selected WLn, WLn–1 to WLn–x. BTM DMY, IDPDMY deck0, and IDPDMY deck1. ACS (e.g., source line) represents a source line, for example, source line 114 in FIG. 1, connected to all memory strings in stack 400. Channel preparation period represents the time period from $t_0$ to $t_4$ and proceeds the programming period of the memory cell in deck2 of FIG. 4 that is coupled to selected WLn and is selected for programming. Channel preparation period can be divided into stage 1 and stage 2, with stage 1 from $t_0$ to $t_2$ and stage 2 from $t_2$ to $t_4$.

In some implementations, to reduce program disturb during a program operation of a memory cell in deck2 of FIG. 4, a voltage of Vpre (e.g., first voltage) is applied at $t_1$ (e.g., first time) to selected WLn and WLn–1 to WLn–x, to increase the voltages of selected WLn and WLn–1 to WLn–x from Vss (e.g., third voltage) to Vpre during stage 1 of the channel preparation period, so that channel potentials associated with memory cells coupled to word lines WLn–x to WLn can be increased during the channel preparation period and the memory cells coupled to word lines WLn–x to WLn can be turned on. The increased channel potentials associated with the memory cells coupled to word lines WLn–x to WLn can then help reduce program disturb from hot current injection when a programming voltage Vpgm is applied to the memory cell in deck2 of FIG. 4 to program the memory cell. An example value of Vss is 0V. An example range of Vpre is 0V to 3.3V. A stage 2 voltage, for example, Vss or a value that is larger than 0V, is applied at $t_2$ (e.g., second time) to selected WLn and WLn–1 to WLn–x to reduce the voltages of selected WLn and WLn–1 to WLn–x from Vpre to the stage 2 voltage. An example range of the stage 2 voltage from $t_2$ to $t_4$ can be 0V to 2V. At $t_4$, which is the end of the channel preparation period and the beginning of the programming period of the memory cell in deck2, a pass voltage Vpass is applied to WLn–1 to WLn–x to increase the voltages of WLn–1 to WLn–x from the stage 2 voltage (e.g., fourth voltage) to the pass voltage Vpass. Starting from $t_4$, the voltage of selected WLn increases from the stage 2 voltage (e.g., second voltage), first to an intermediate voltage, and then to a programming voltage Vpgm. In some implementations, when a specific voltage is applied to a line at a specific time, due to the loading effect associated with the line, it may take some time for the voltage of the line to reach that specific voltage. For example, when Vpre is applied to selected WLn at $t_1$, it may take some time for the voltage of selected WLn to increase from Vss to Vpre, as shown in FIG. 5A. In some other implementations, the voltage of the line can reach the applied specific voltage instantly at the specific time.

In some implementations, the voltages (e.g., fifth voltage) of word lines represented by the other WL stay at Vss during the channel preparation period from $t_0$ to $t_4$, as memory cells coupled to word lines represented by the other WL can stay off during the channel preparation period. A voltage of Vpre_dmy (e.g., sixth voltage) is applied at $t_1$ to BTM DMY, IDPDMY deck0, and IDPDMY deck1 to increase the voltages of BTM DMY, IDPDMY deck0, and IDPDMY deck1 from an initial voltage to Vpre_dmy during the channel preparation period, so that dummy memory cells coupled to dummy word lines BTM DMY, IDPDMY deck0, and IDPDMY deck1 can be turned on during the channel preparation period. An example value of Vpre_dmy can be 2.2V in order to turn on the respective dummy memory cells. A dummy line voltage is applied at $t_3$ (e.g., third time) to BTM DMY, IDPDMY deck0, and IDPDMY deck1 to reduce the voltages of BTM DMY, IDPDMY deck0, and IDPDMY deck1 from Vpre-dmy to the dummy line voltage during stage 2 of the channel preparation period. $t_3$ can be the same as $t_2$ or $t_3$ can be later than $t_2$. At $t_4$, a pass voltage Vpass is applied to BTM DMY, IDPDMY deck0, and IDPDMY deck1 to increase the voltages of BTM DMY, IDPDMY deck0, and IDPDMY deck1 from the dummy line voltage to the pass voltage Vpass.

In some implementations, a turn-on voltage (e.g., seventh voltage) is applied at $t_1$ to BSG to increase the voltage of BSG from Vss to the turn-on voltage to turn on transistors coupled to BSG, for example, SSG 110 in FIG. 1, in order to connect the channels of the memory strings in stack 400 to ACS, for example, source line 114 in FIG. 1. An example value of the turn-on voltage is 2.2V. A voltage of Vss is applied at $t_3$ to BSG to reduce the voltage of BSG from the turn-on voltage to Vss during stage 2 of the channel preparation period.

In some implementations, the voltage of ACS (e.g., eighth voltage) stays at Vss during the channel preparation period from $t_0$ to $t_4$, or a channel pre-charge voltage can be applied to ACS at $t_1$ to increase the voltage of ACS from Vss to the channel pre-charge voltage to pre-charge the channels of the memory strings in stack 400. In either case, the voltage of ACS, either Vss or the channel pre-charge voltage, can be used to increase the channel potentials of memory cells in stack 400. An example value of the channel pre-charge voltage is 2.2V.

Figure 5B:
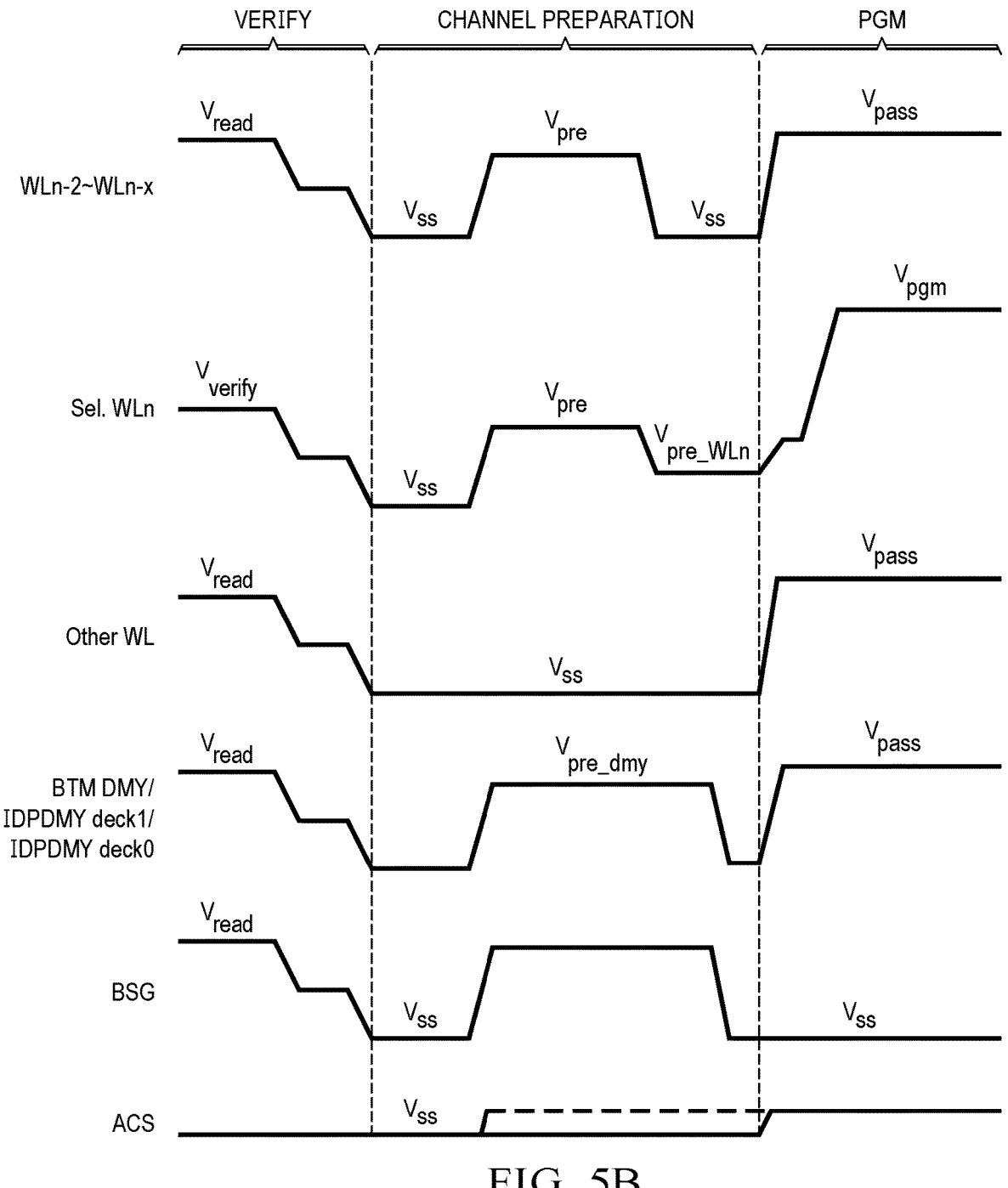
FIG. 5B illustrates another example of voltages of components in the memory cell stack in FIG. 4 during programming of a memory cell in deck2 of FIG. 4, according to some aspects of the present disclosure.

FIG. 5B illustrates another example of voltages of components in stack 400 of FIG. 4 during programming of a memory cell in deck2 of FIG. 4, according to some aspects of the present disclosure. Voltage conditions of most components of stack 400, for example, WLn−1 to WLn−x, other WL, BTM DMY, IDPDMY deck0, IDPDMY deck1, BSG, and ACS, are identical to their counterparts in FIG. 5A, except for selected WLn. More specifically, as shown in FIG. 5B, at $t_2$, the beginning of stage 2 of the channel preparation period, a voltage of Vpre_WLn (e.g., second voltage) is applied to selected WLn to reduce the voltage of selected WLn from Vpre to Vpre_WLn, whereas in FIG. 5A, the stage 2 voltage is applied at $t_2$ to selected WLn to reduce the voltage of selected WLn from Vpre to the stage 2 voltage. Vpre_WLn can be larger than the stage 2 voltage. An example range of Vpre_WLn is 0V to 3.3V.

Figure 5C:
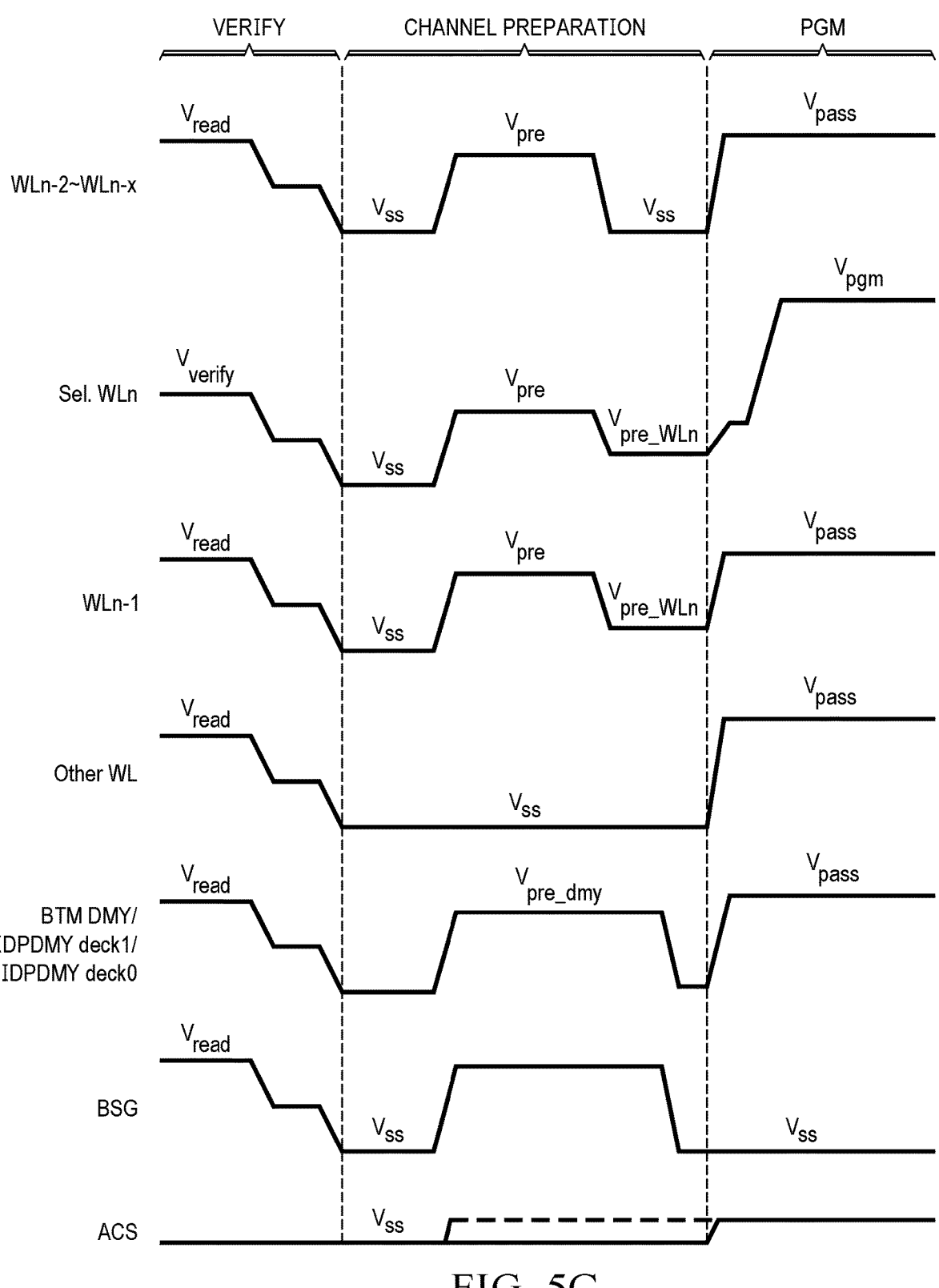
FIG. 5C illustrates another example of voltages of components in the memory cell stack in FIG. 4 during programming of a memory cell in deck2 of FIG. 4, according to some aspects of the present disclosure.

FIG. 5C illustrates another example of voltages of components in stack 400 of FIG. 4 during programming of a memory cell in deck2 of FIG. 4, according to some aspects of the present disclosure. Voltage conditions of most components of stack 400, for example, WLn−2 to WLn−x, other WL, BTM DMY, IDPDMY deck0, IDPDMY deck1, BSG, and ACS, are identical to their counterparts in FIG. 5B, except for WLn−1. More specifically, as shown in FIG. 5C, at $t_2$, the beginning of stage 2 of the channel preparation period, a voltage of Vpre_WLn is applied to WLn−1 to reduce the voltage of WLn−1 from Vpre to Vpre_WLn, whereas in FIG. 5B, the stage 2 voltage is applied at $t_2$ to WLn−1 to reduce the voltage of WLn−1 from Vpre to the stage 2 voltage. In some implementations, the voltage conditions of one or more word lines in WLn−2 to WLn−x that are closer to WLn−1 can be the same as the voltage condition of WLn−1.

Figure 6:
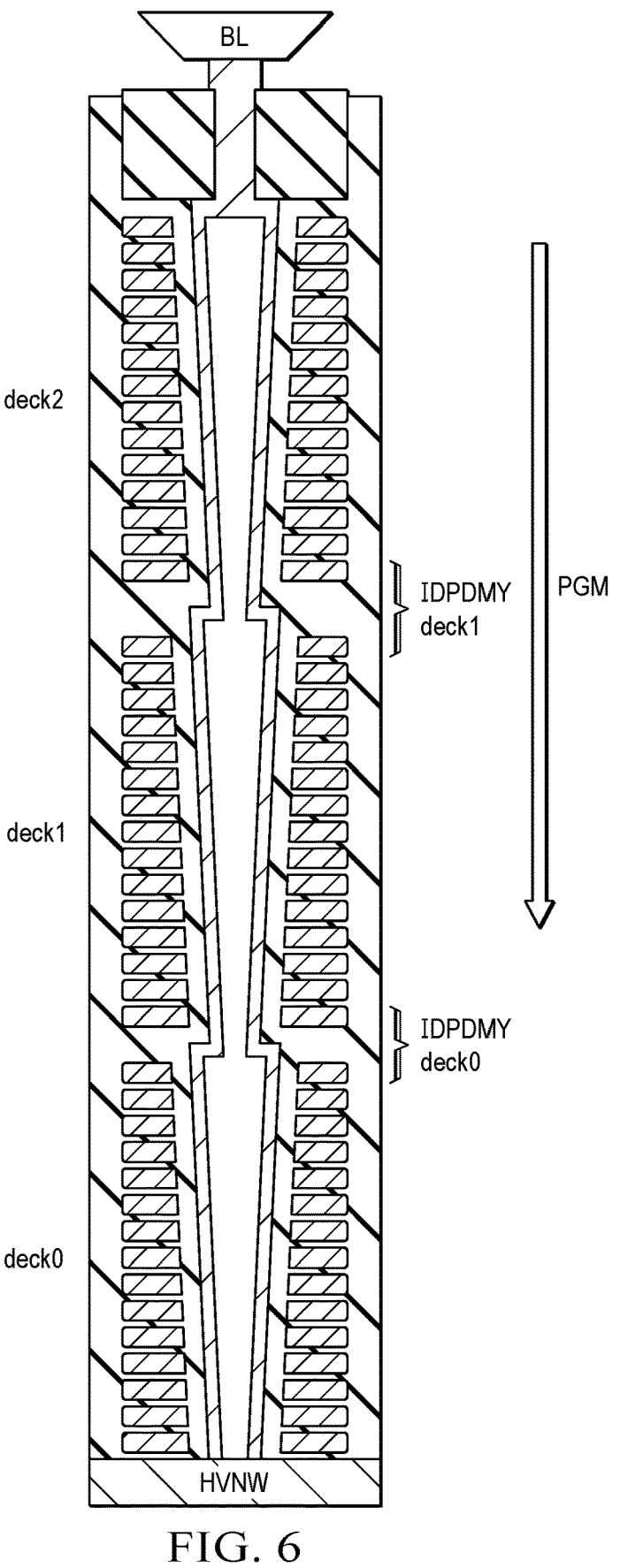
FIG. 6 illustrates the example memory cell stack in FIG. 4, with deck1 having a memory cell selected for programming, according to some aspects of the present disclosure.

FIG. 6 illustrates the example memory cell stack 400 in FIG. 4, with deck1, instead of deck2 or deck0, having a memory cell selected for programming, according to some aspects of the present disclosure. The programming process of stack 400 is from top to bottom, the same as that in FIG. 4.

Figure 7A:
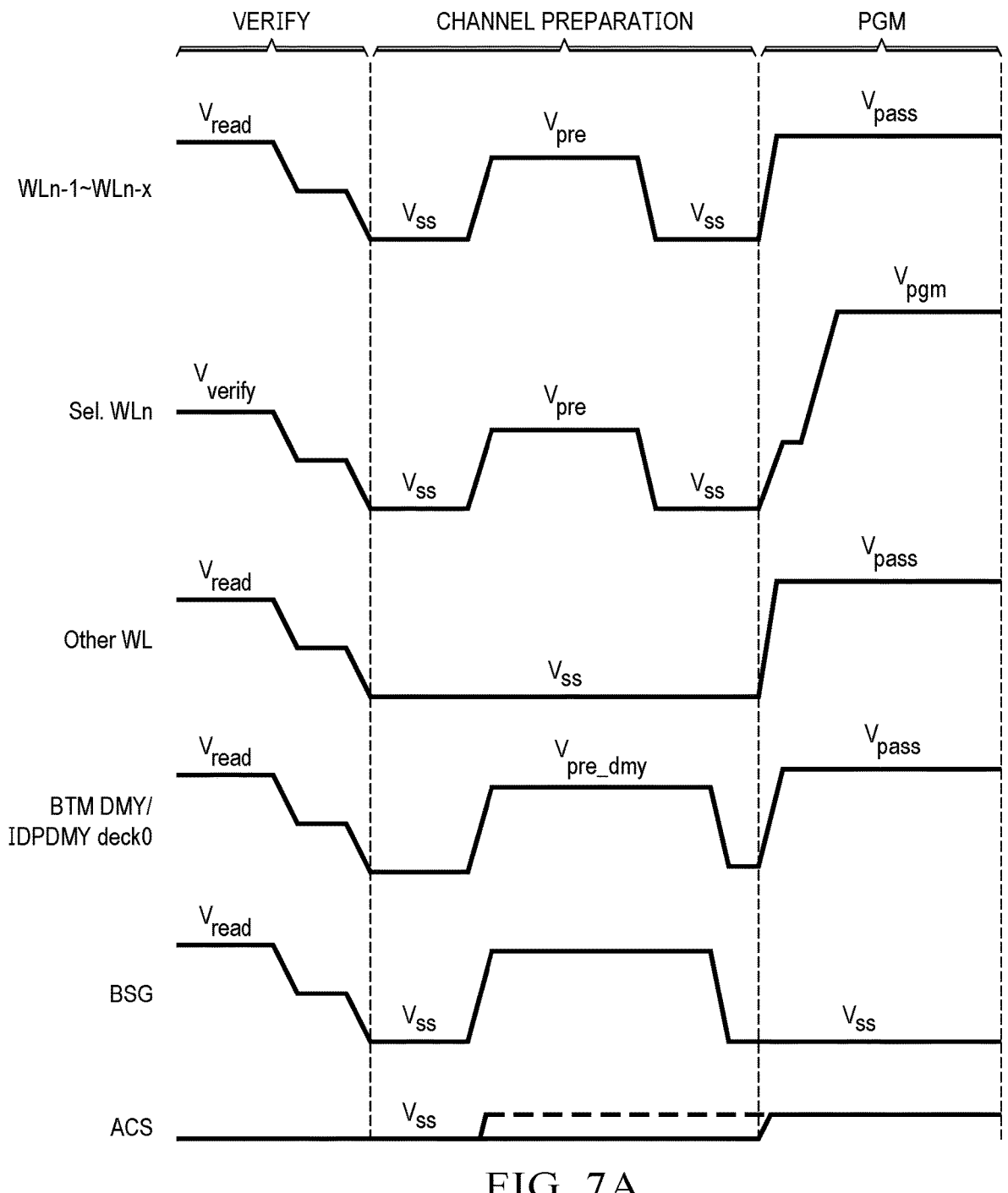
FIG. 7A illustrates an example of voltages of components in the memory cell stack of FIG. 6 during programming of a memory cell in deck1 of FIG. 6, according to some aspects of the present disclosure.

FIG. 7A illustrates an example of voltages of components in the memory cell stack of FIG. 6 during programming of a memory cell in deck1 of FIG. 6, according to some aspects of the present disclosure. Voltage conditions of most components of stack 400, for example, selected WLn, WLn−1 to WLn−x, other WL, BTM DMY, IDPDMY deck0, BSG, and ACS, are identical to their counterparts in FIG. 5A, except for IDPDMY deck1. More specifically, when WLn−x is in deck1 of FIG. 6, because the memory cell selected for programming is in deck1, instead of deck2, the voltage condition for IDPDMY deck1 in FIG. 6 is represented by the voltage condition of the other WL in FIG. 7A, given the top to bottom programming process of memory cells in FIG. 6. When WLn−x is in deck2 while the memory cell selected for programming is in deck1, IDPDMY deck1 is positioned between WLn−x and WLn, and therefore the voltage condition for IDPDMY deck1 is identical to the voltage condition of BTM DMY or IDPDMY deck0 in FIG. 7A, so that dummy memory cells coupled to IDPDMY deck1 can be turned on.

Figure 7B:
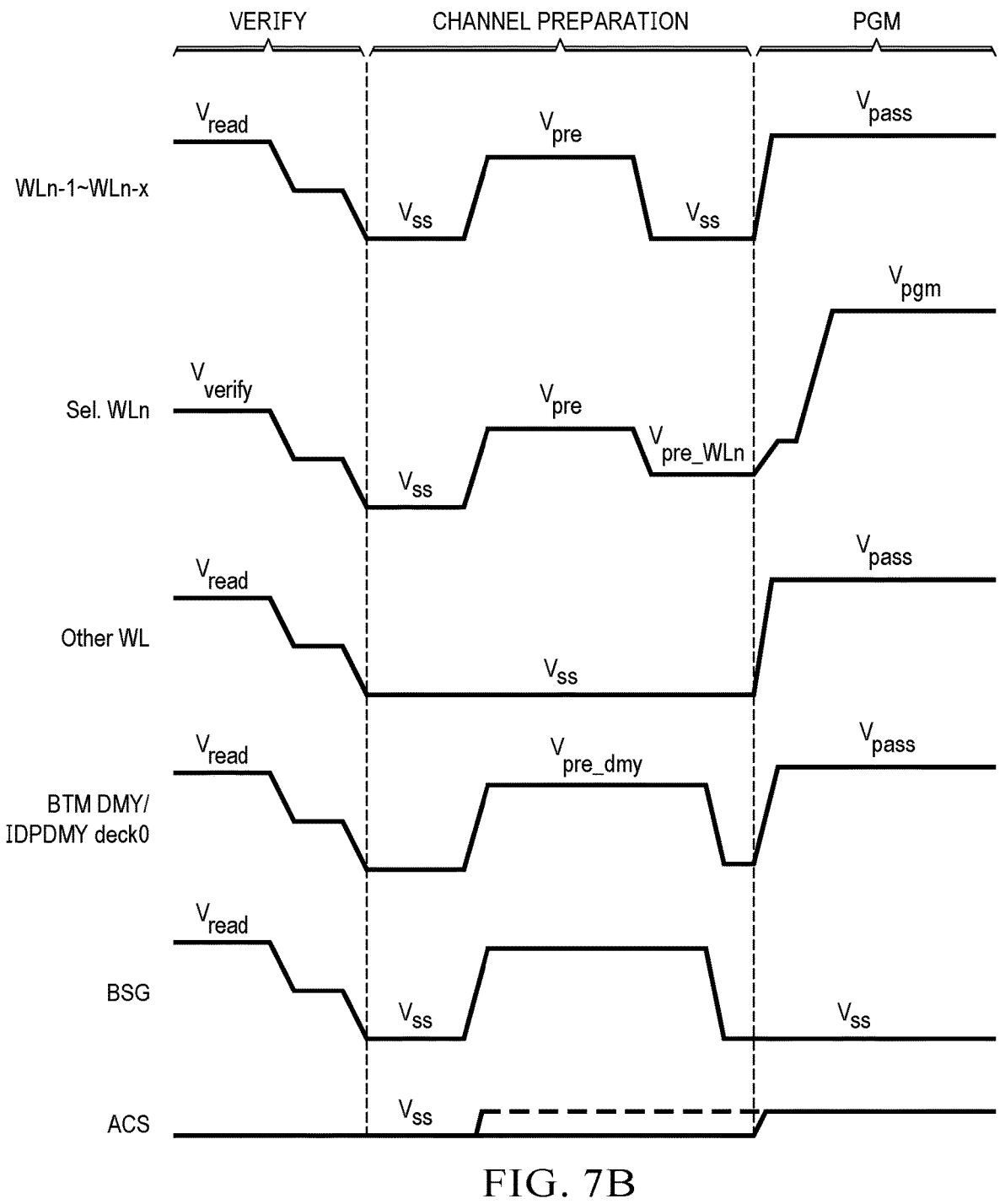
FIG. 7B illustrates another example of voltages of components in the memory cell stack of FIG. 6 during programming of a memory cell in deck1 of FIG. 6, according to some aspects of the present disclosure.

FIG. 7B illustrates another example of voltages of components in the memory cell stack of FIG. 6 during programming of a memory cell in deck1 of FIG. 6, according to some aspects of the present disclosure. Voltage conditions of most components of stack 400, for example, selected WLn, WLn−1 to WLn−x, other WL, BTM DMY, IDPDMY deck0, BSG, and ACS, are identical to their counterparts in FIG. 5B, except for IDPDMY deck1. More specifically, when WLn−x is in deck1 of FIG. 6, because the memory cell selected for programming is in deck1, instead of deck2, the voltage condition for IDPDMY deck1 in FIG. 6 is represented by the voltage condition of the other WL in FIG. 7B, instead of the voltage conditions of BTM DMY and IDPDMY deck0, given the top to bottom programming process of memory cells in FIG. 6. When WLn−x is in deck2 while the memory cell selected for programming is in deck1, IDPDMY deck1 is positioned between WLn−x and WLn, and therefore the voltage condition for IDPDMY deck1 is identical to the voltage condition of BTM DMY or IDPDMY deck0 in FIG. 7B, so that dummy memory cells coupled to IDPDMY deck1 can be turned on.

Figure 7C:
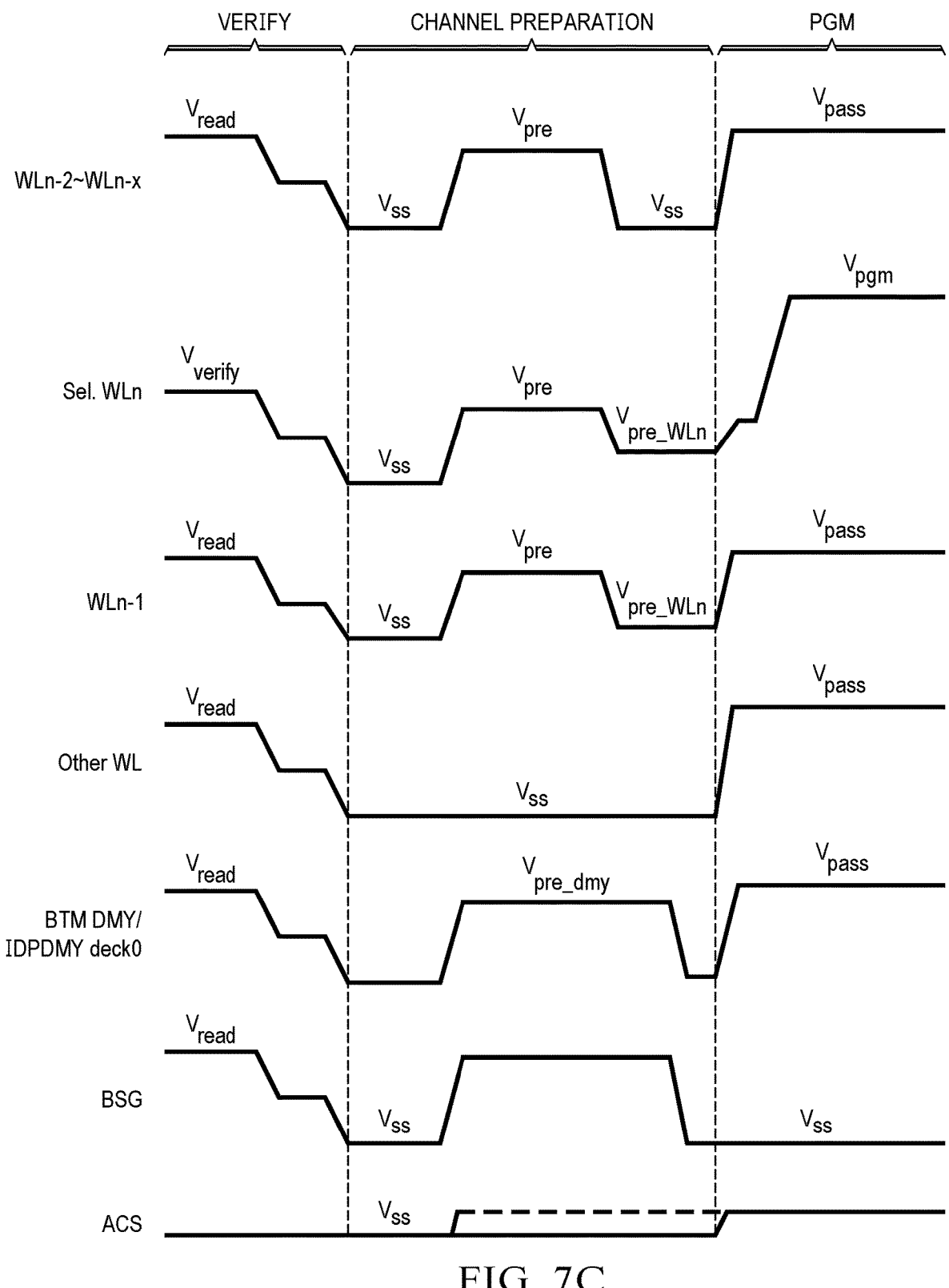
FIG. 7C illustrates another example of voltages of components in the memory cell stack of FIG. 6 during programming of a memory cell in deck1 of FIG. 6, according to some aspects of the present disclosure.

FIG. 7C illustrates another example of voltages of components in the memory cell stack of FIG. 6 during programming of a memory cell in deck1 of FIG. 6, according to some aspects of the present disclosure. Voltage conditions of most components of stack 400, for example, selected WLn, WLn−1 to WLn−x, other WL, BTM DMY, IDPDMY deck0, BSG, and ACS, are identical to their counterparts in FIG. 5C, except for IDPDMY deck1. More specifically, when WLn−x is in deck1 of FIG. 6, because the memory cell selected for programming is in deck1, instead of deck2, the voltage condition for IDPDMY deck1 in FIG. 6 is represented by the voltage condition of the other WL in FIG. 7C, instead of the voltage conditions of BTM DMY and IDPDMY deck0, given the top to bottom programming process of memory cells in FIG. 6. When WLn−x is in deck2 while the memory cell selected for programming is in deck1, IDPDMY deck1 is positioned between WLn−x and WLn, and therefore the voltage condition for IDPDMY deck1 is identical to the voltage condition of BTM DMY or IDPDMY deck0 in FIG. 7C, so that dummy memory cells coupled to IDPDMY deck1 can be turned on.

Figure 8:
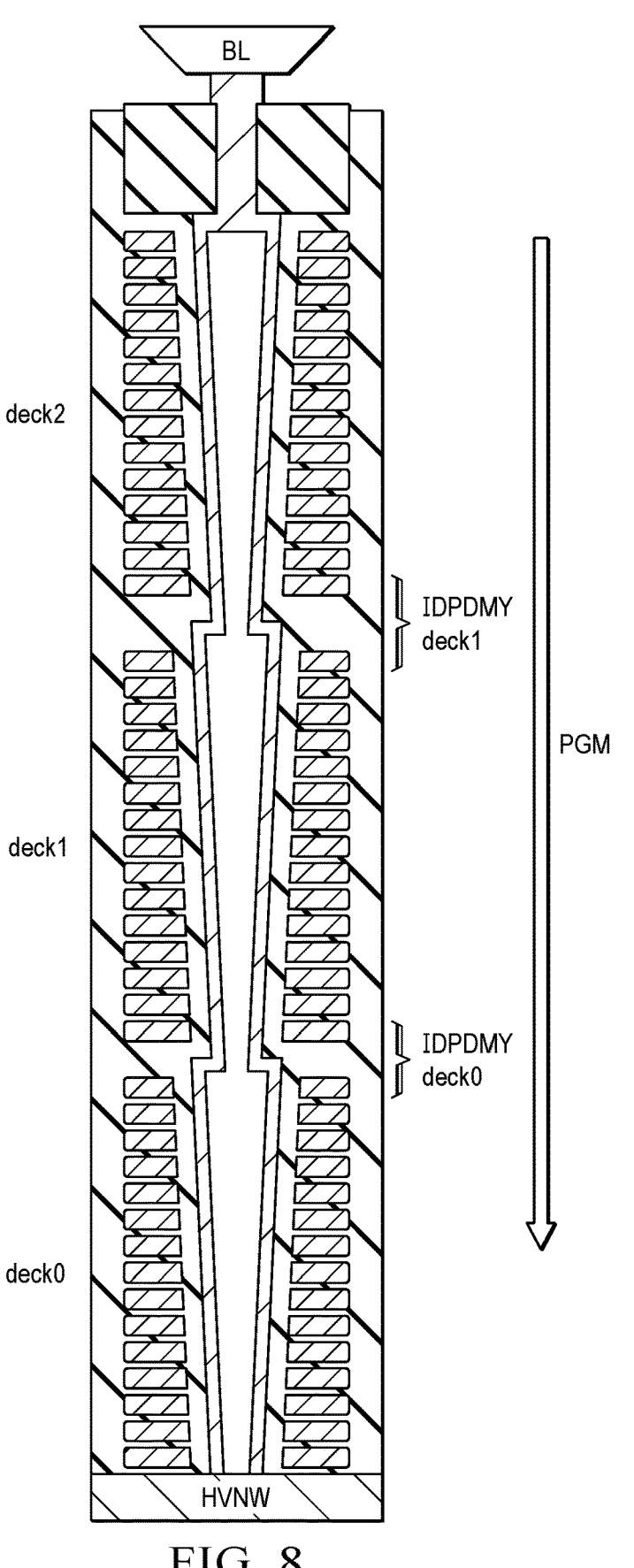
FIG. 8 illustrates the example memory cell stack in FIG. 4, with deck0 having a memory cell selected for programming, according to some aspects of the present disclosure.

FIG. 8 illustrates the example memory cell stack 400 in FIG. 4, with deck0, instead of deck2 or deck1, having a memory cell selected for programming, according to some aspects of the present disclosure. The programming process of stack 400 is from top to bottom, the same as that in FIG. 4.

Figure 9A:
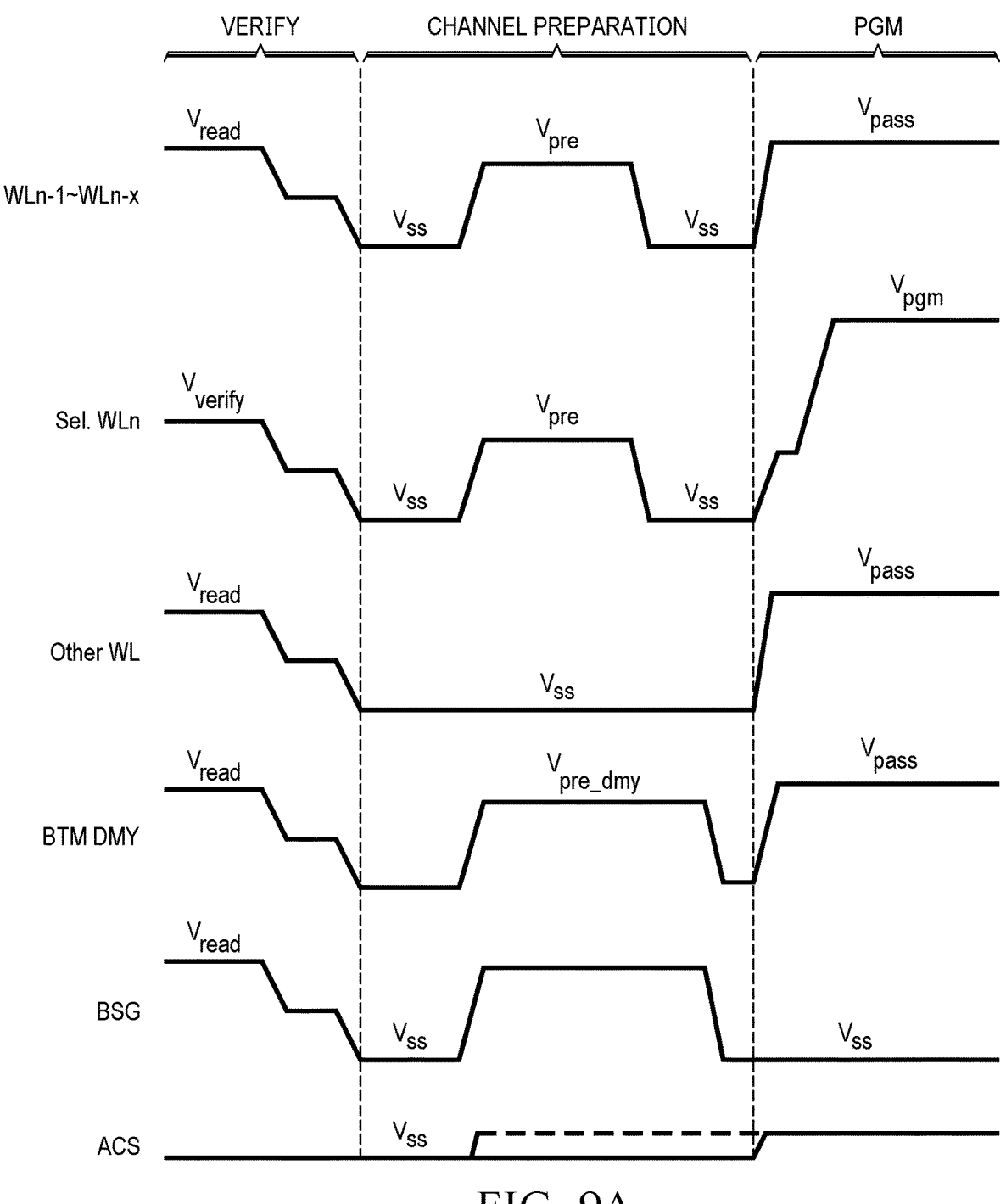
FIG. 9A illustrates an example of voltages of components in the memory cell stack of FIG. 8 during programming of a memory cell in deck0 of FIG. 8, according to some aspects of the present disclosure.

FIG. 9A illustrates an example of voltages of components in the memory cell stack of FIG. 8 during programming of a memory cell in deck0 of FIG. 8, according to some aspects of the present disclosure. Voltage conditions of most components of stack 400, for example, selected WLn, WLn−1 to WLn−x, other WL, BTM DMY, IDPDMY deck1, BSG, and ACS, are identical to their counterparts in FIG. 7A, except for IDPDMY deck0. More specifically, when WLn−x is in deck0 of FIG. 8, because the memory cell selected for programming is in deck0, instead of deck1, the voltage condition for IDPDMY deck0 in FIG. 8 is represented by the voltage condition of the other WL in FIG. 9A, given the top to bottom programming process of memory cells in FIG. 8. When WLn−x is in deck1 while the memory cell selected for programming is in deck0, IDPDMY deck0 is positioned between WLn−x and WLn, and therefore the voltage condition for IDPDMY deck0 is identical to the voltage condition of BTM DMY in FIG. 9A, so that dummy memory cells coupled to IDPDMY deck0 can be turned on.

Figure 9B:
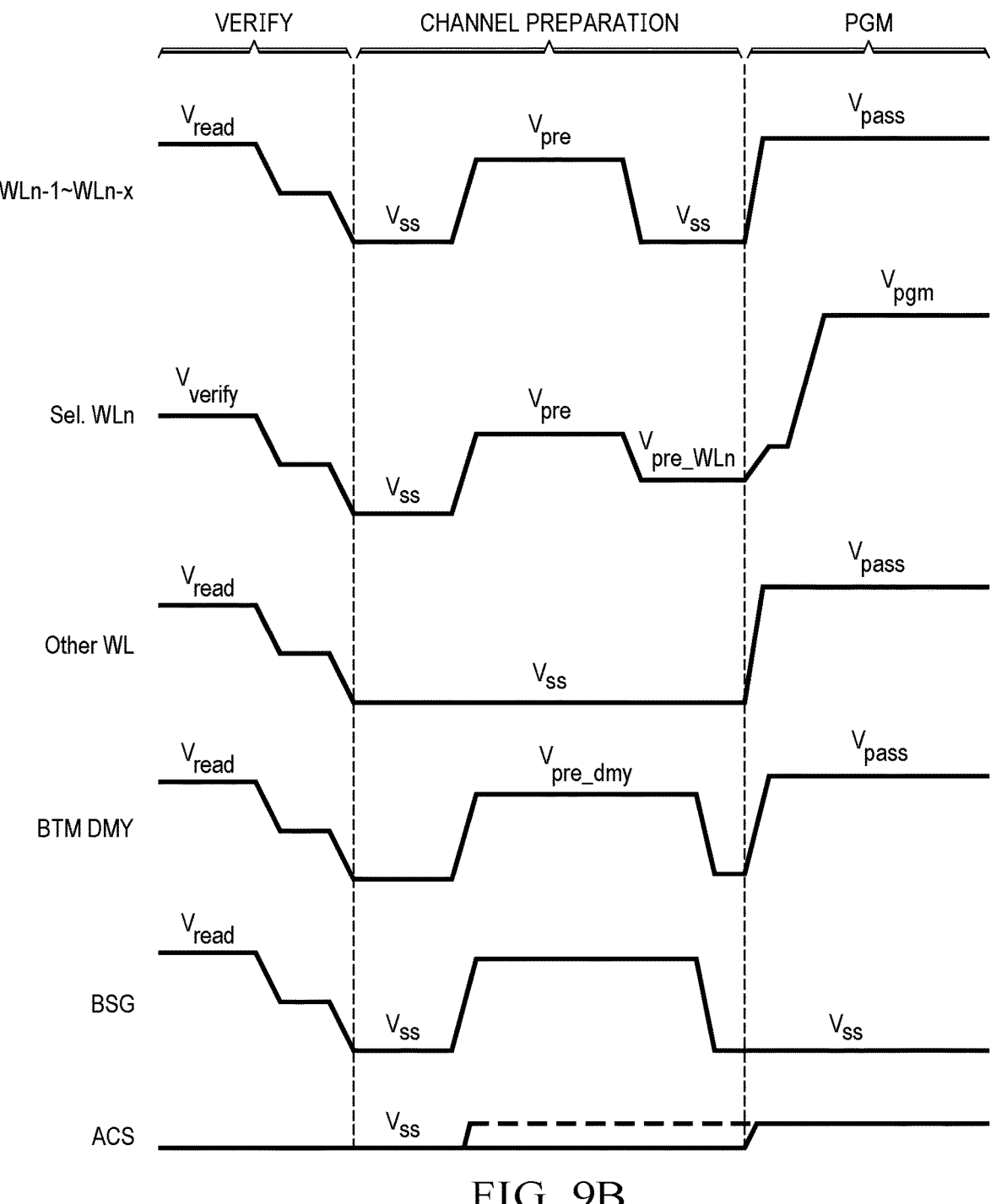
FIG. 9B illustrates another example of voltages of components in the memory cell stack of FIG. 8 during programming of a memory cell in deck0 of FIG. 8, according to some aspects of the present disclosure.

FIG. 9B illustrates another example of voltages of components in the memory cell stack of FIG. 8 during programming of a memory cell in deck0 of FIG. 8, according to some aspects of the present disclosure. Voltage conditions of most components of stack 400, for example, selected WLn, WLn−1 to WLn−x, other WL, BTM DMY, IDPDMY deck1, BSG, and ACS, are identical to their counterparts in FIG. 7B, except for IDPDMY deck0. More specifically, when WLn−x is in deck0 of FIG. 8, because the memory cell selected for programming is in deck0, instead of deck1, the voltage condition for IDPDMY deck0 in FIG. 8 is represented by the voltage condition of the other WL in FIG. 9B, given the top to bottom programming process of memory cells in FIG. 8. When WLn−x is in deck1 while the memory cell selected for programming is in deck0, IDPDMY deck0 is positioned between WLn−x and WLn, and therefore the voltage condition for IDPDMY deck0 is identical to the voltage condition of BTM DMY in FIG. 9B, so that dummy memory cells coupled to IDPDMY deck0 can be turned on.

Figure 9C:
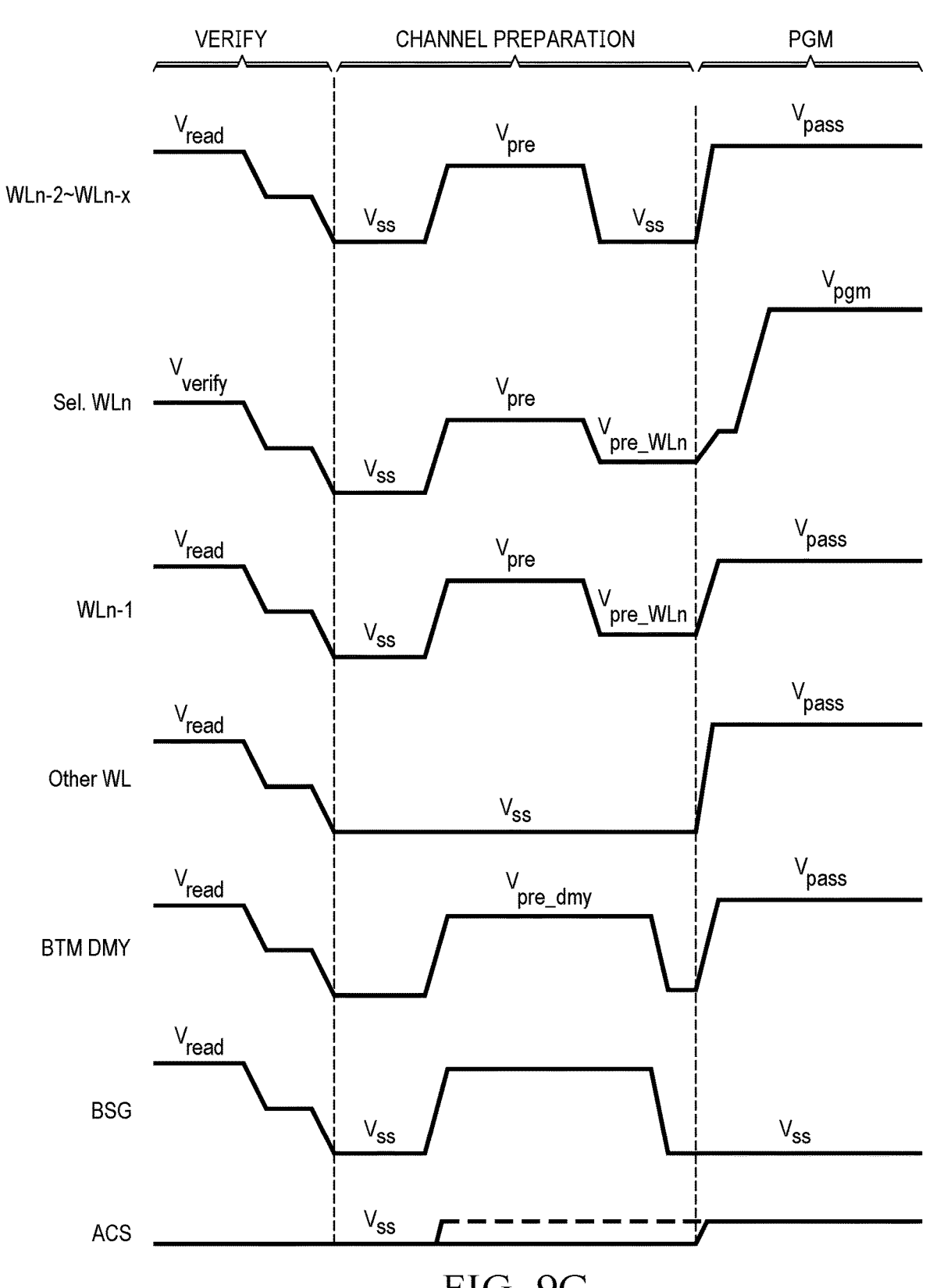
FIG. 9C illustrates another example of voltages of components in the memory cell stack of FIG. 8 during programming of a memory cell in deck0 of FIG. 8, according to some aspects of the present disclosure.

FIG. 9C illustrates another example of voltages of components in the memory cell stack of FIG. 8 during programming of a memory cell in deck0 of FIG. 8, according to some aspects of the present disclosure. Voltage conditions of most components of stack 400, for example, selected WLn, WLn−1 to WLn−x, other WL, BTM DMY, IDPDMY deck1, BSG, and ACS, are identical to their counterparts in FIG. 7C, except for IDPDMY deck0. More specifically, when WLn−x is in deck0 of FIG. 8, because the memory cell selected for programming is in deck0, instead of deck1, the voltage condition for IDPDMY deck0 in FIG. 8 is represented by the voltage condition of the other WL in FIG. 9C, given the top to bottom programming process of memory cells in FIG. 8. When WLn−x is in deck1 while the memory cell selected for programming is in deck0, IDPDMY deck0 is positioned between WLn−x and WLn, and therefore the voltage condition for IDPDMY deck0 is identical to the voltage condition of BTM DMY in FIG. 9C, so that dummy memory cells coupled to IDPDMY deck0 can be turned on.

In some implementations, memory cells in stack 400 of FIG. 4 can include multi-level cells, for example, quad-level cells (QTCs). The program operation of a memory cell in stack 400 can include a coarse programming of the memory cell and a fine programming of the memory cell. Coarse programming can be used together with fine programming to achieve tight threshold distributions without excessively slowing down the programming process of a memory cell. During the coarse programming phase, the threshold voltage for programming a memory cell can increase in a faster manner, whereas during the fine programming phase, the threshold voltage can increase in a slower manner in order to reach the target threshold voltage while also achieving a tighter threshold distribution.

In some implementations, voltage conditions illustrated in FIGS. 5A to 5C, 7A to 7C, and 9A to 9C and described above can be applied to coarse programming of a memory cell in stack 400. More specifically, voltage conditions illustrated in FIG. 5A, 5B, or 5C can be applied to coarse programming of a memory cell in deck2 of stack 400, voltage conditions illustrated in FIG. 7A, 7B, or 7C can be applied to coarse programming of a memory cell in deck1 of stack 400, and voltage conditions illustrated in FIG. 9A, 9B, or 9C can be applied to coarse programming of a memory cell in deck0 of stack 400.

In some implementations, for fine programming of a memory cell in stack 400 that is coupled to selected WLn, the voltage condition of word line WLn+1 (e.g., seventh word line) during the channel preparation period from $t_0$ to $t_4$ in FIG. 5A can be the same as the voltage condition of selected WLn during the channel preparation period, instead of being the same as the voltage condition of other WL during the channel preparation period, in order to further reduce program disturb during the fine programming of the memory cell coupled to selected WLn. WLn+1 is the word line that is coupled to memory cells (e.g., second memory cell) that have not been programmed and is positioned immediately below WLn that is selected for programming.

Figure 10A:
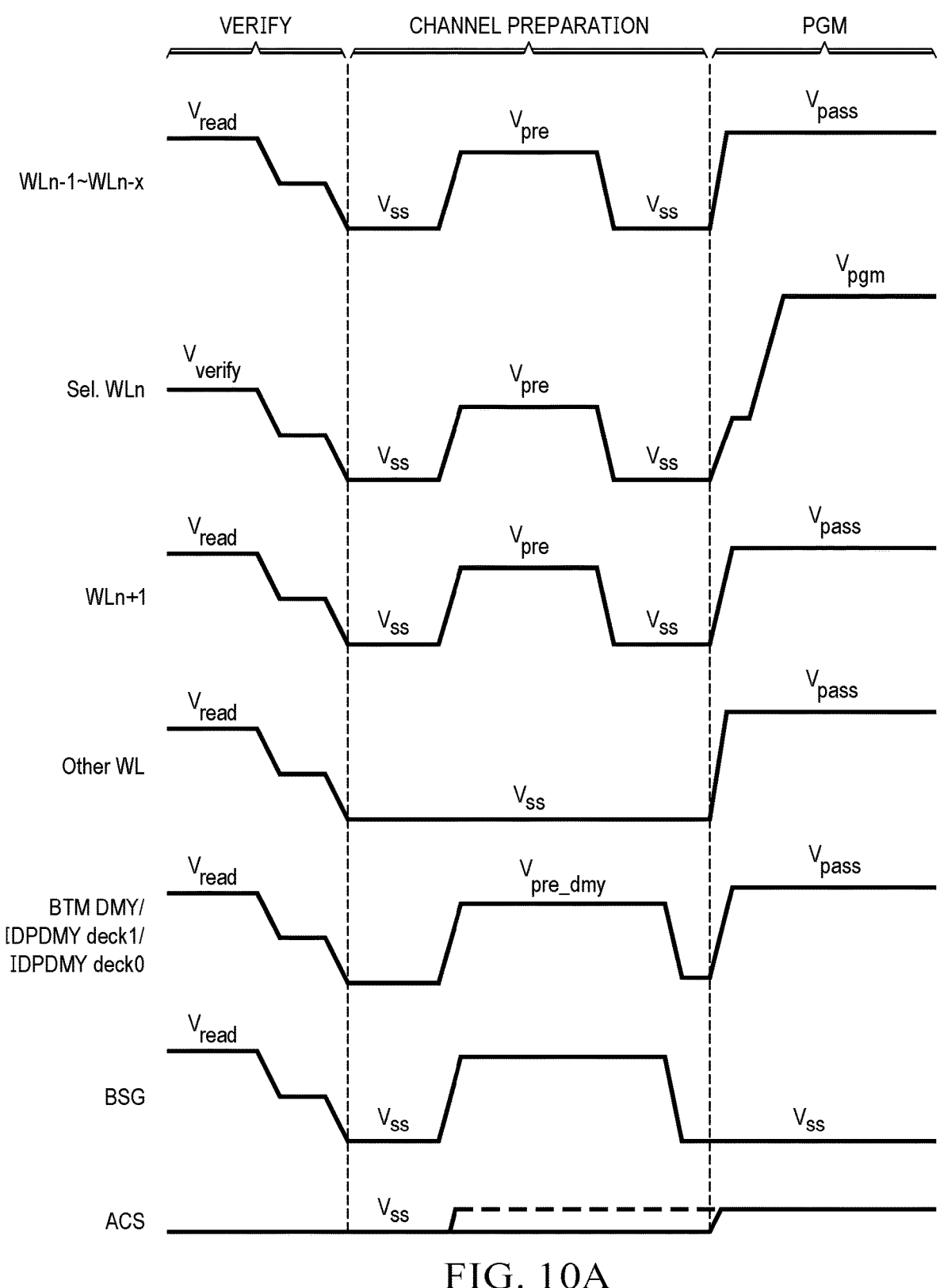
FIG. 10A illustrates an example of voltages of components in the memory cell stack of FIG. 4 during fine programming of a memory cell in deck2 of FIG. 4, according to some aspects of the present disclosure.

In some implementations, FIG. 10A illustrates an example of voltages of components in stack 400 of FIG. 4 during fine programming of a memory cell in deck2 of stack 400, according to some aspects of the present disclosure. The example in FIG. 10A is for fine programming of the memory cell in deck2 of stack 400 after the coarse programming of the memory cell in deck2. Voltage conditions of most of the stack 400 components shown in FIG. 10A, for example, selected WLn, WLn−1 to WLn−x, other WL, BTM DMY, IDPDMY deck0, IDPDMY deck1, BSG, and ACS, are identical to their counterparts in FIG. 5A, except for WLn+ 1. As shown in FIG. 10A, the voltage condition of word line WLn+1 during the channel preparation period is the same as the voltage condition of selected WLn during the channel preparation period, instead of being the same as the voltage condition of other WL during the channel preparation period, in order to turn on memory cells coupled to WLn+1 during the channel preparation period, so that program disturb during the fine programming of the memory cell coupled to selected WLn can be further reduced.

Figure 10B:
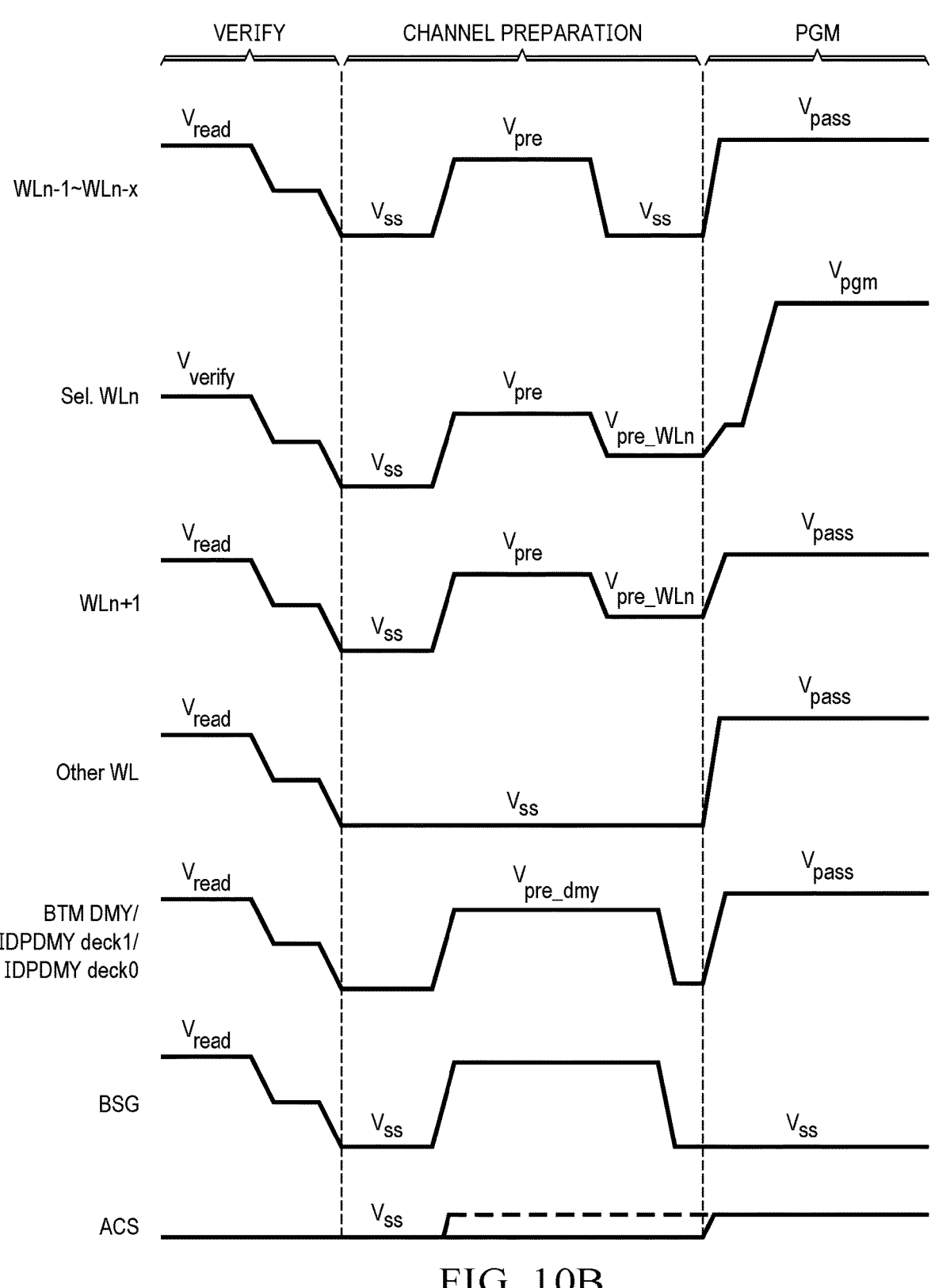
FIG. 10B illustrates another example of voltages of components in the memory cell stack of FIG. 4 during fine programming of a memory cell in deck2 of FIG. 4, according to some aspects of the present disclosure.

FIG. 10B illustrates another example of voltages of components in stack 400 of FIG. 4 during fine programming of a memory cell in deck2 of FIG. 4, according to some aspects of the present disclosure. Voltage conditions of most of the stack 400 components shown in FIG. 10B, for example, selected WLn, WLn−1 to WLn−x, other WL, BTM DMY, IDPDMY deck0, IDPDMY deck1, BSG, and ACS, are identical to their counterparts in FIG. 5B, except for WLn+1. As shown in FIG. 10B, the voltage condition of word line WLn+1 during the channel preparation period is the same as the voltage condition of selected WLn during the channel preparation period, instead of being the same as the voltage condition of other WL during the channel preparation period, in order to further reduce program disturb during the fine programming of the memory cell coupled to selected WLn.

Figure 10C:
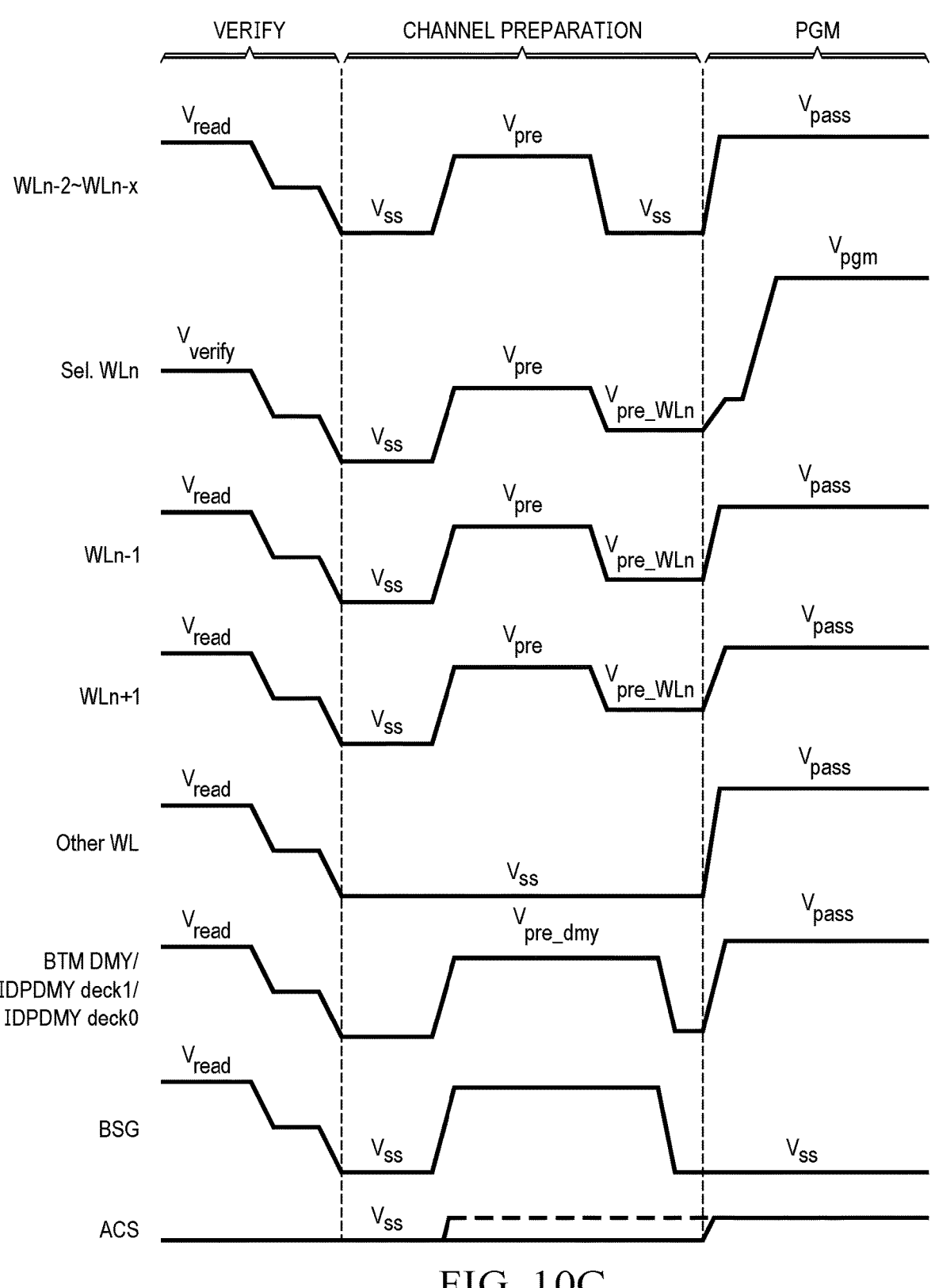
FIG. 10C illustrates another example of voltages of components in the memory cell stack of FIG. 4 during fine programming of a memory cell in deck2 of FIG. 4, according to some aspects of the present disclosure.

FIG. 10C illustrates another example of voltages of components in stack 400 of FIG. 4 during fine programming of a memory cell in deck2 of FIG. 4, according to some aspects of the present disclosure. Voltage conditions of most of the stack 400 components shown in FIG. 10C, for example, selected WLn, WLn−1 to WLn−x, other WL, BTM DMY, IDPDMY deck0, IDPDMY deck1, BSG, and ACS, are identical to their counterparts in FIG. 5C, except for WLn+1. As shown in FIG. 10C, the voltage condition of word line WLn+1 during the channel preparation period is the same as the voltage condition of selected WLn during the channel preparation period, instead of being the same as the voltage condition of other WL during the channel preparation period, in order to further reduce program disturb during the fine programming of the memory cell coupled to selected WLn.

Figure 11A:
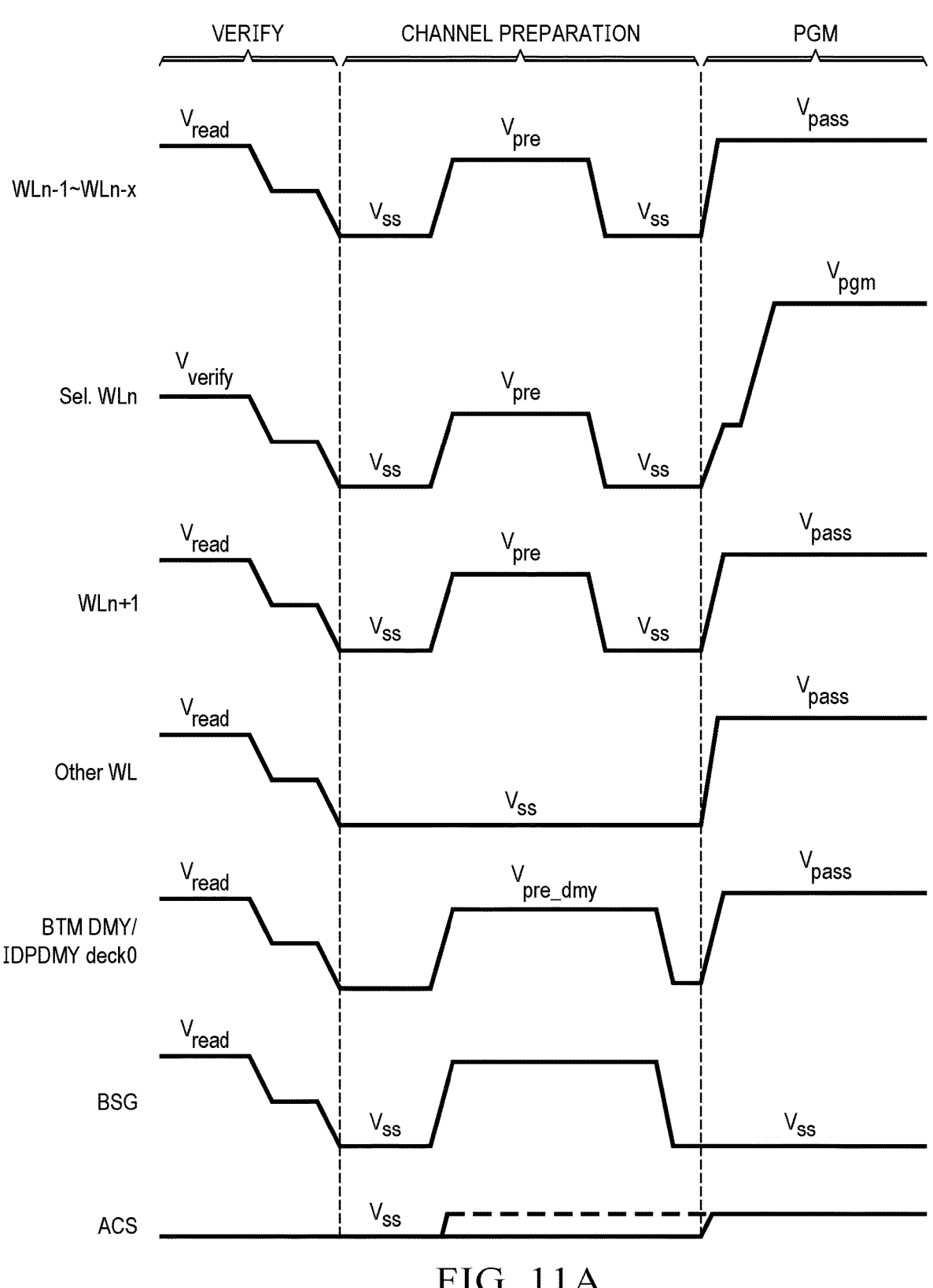
FIG. 11A illustrates an example of voltages of components in the memory cell stack of FIG. 4 during fine programming of a memory cell in deck1 of FIG. 4, according to some aspects of the present disclosure.

FIG. 11A illustrates an example of voltages of components in stack 400 of FIG. 4 during fine programming of a memory cell in deck1 of stack 400, according to some aspects of the present disclosure. Voltage conditions of most of the stack 400 components shown in FIG. 11A, for example, selected WLn, WLn−1 to WLn−x, other WL, BTM DMY, IDPDMY deck0, IDPDMY deck1, BSG, and ACS, are identical to their counterparts in FIG. 7A, except for WLn+1. As shown in FIG. 11A, the voltage condition of word line WLn+1 during the channel preparation period is the same as the voltage condition of selected WLn during the channel preparation period, instead of being the same as the voltage condition of other WL during the channel preparation period, in order to further reduce program disturb during the fine programming of the memory cell coupled to selected WLn.

Figure 11B:
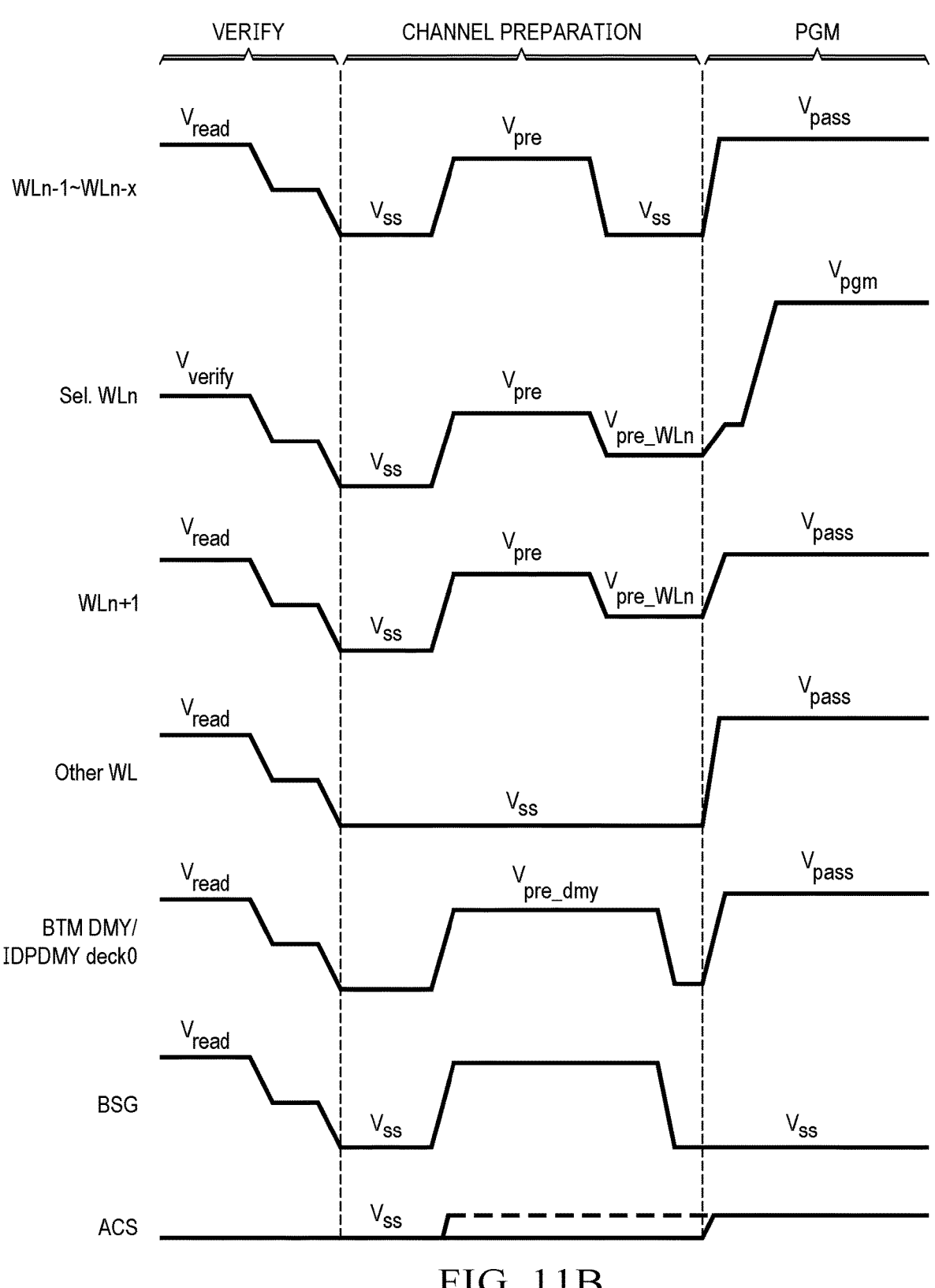
FIG. 11B illustrates another example of voltages of components in the memory cell stack of FIG. 4 during fine programming of a memory cell in deck1 of FIG. 4, according to some aspects of the present disclosure.

FIG. 11B illustrates another example of voltages of components in stack 400 of FIG. 4 during fine programming of a memory cell in deck1 of FIG. 4, according to some aspects of the present disclosure. Voltage conditions of most of the stack 400 components shown in FIG. 11B, for example, selected WLn, WLn−1 to WLn−x, other WL, BTM DMY, IDPDMY deck0, IDPDMY deck1, BSG, and ACS, are identical to their counterparts in FIG. 7B, except for WLn+1. As shown in FIG. 11B, the voltage condition of word line WLn+1 during the channel preparation period is the same as the voltage condition of selected WLn during the channel preparation period, instead of being the same as the voltage condition of other WL during the channel preparation period, in order to further reduce program disturb during the fine programming of the memory cell coupled to selected WLn.

Figure 11C:
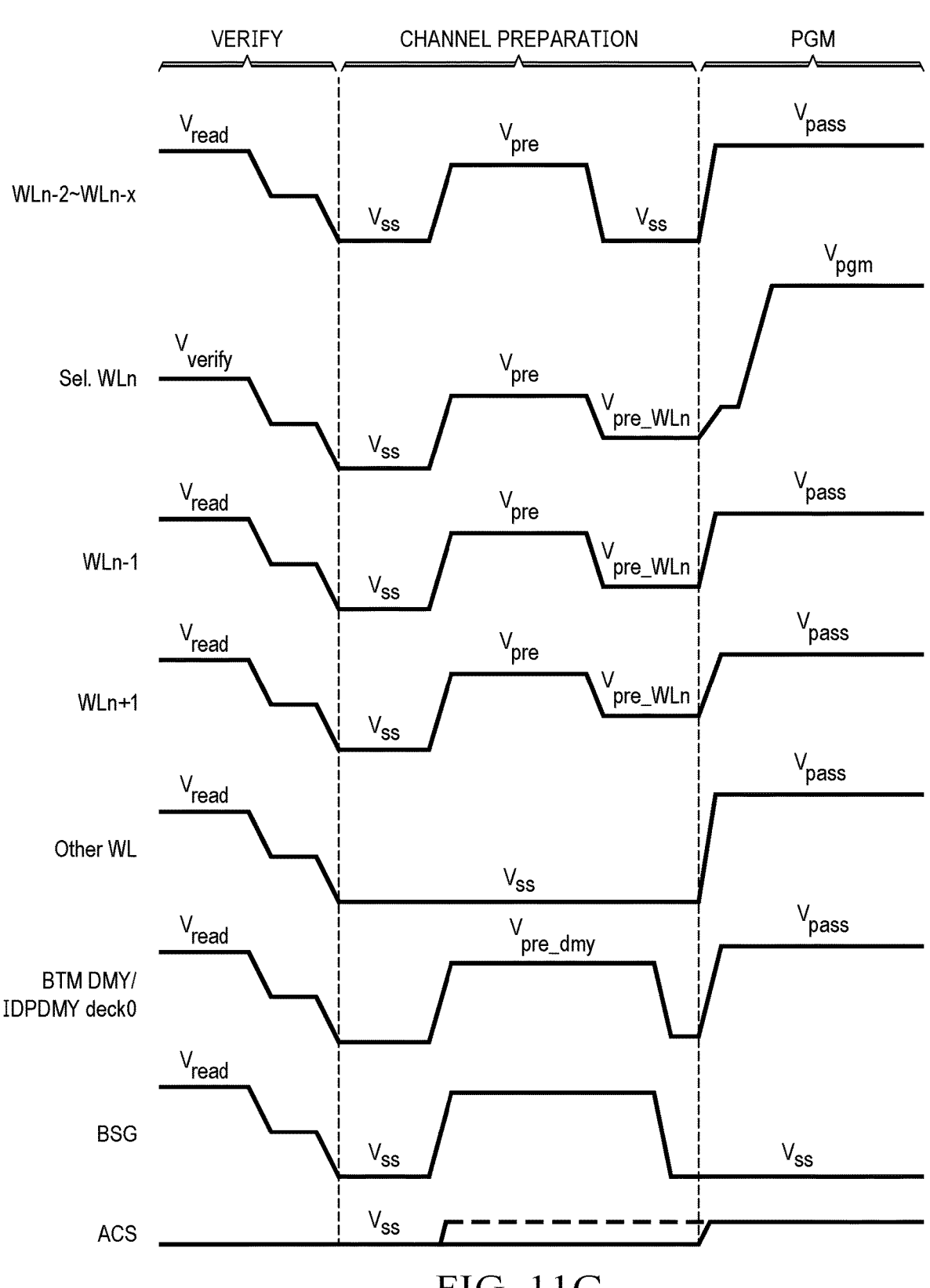
FIG. 11C illustrates another example of voltages of components in the memory cell stack of FIG. 4 during fine programming of a memory cell in deck1 of FIG. 4, according to some aspects of the present disclosure.

FIG. 11C illustrates another example of voltages of components in stack 400 of FIG. 4 during fine programming of a memory cell in deck1 of FIG. 4, according to some aspects of the present disclosure. Voltage conditions of most of the stack 400 components shown in FIG. 11C, for example, selected WLn, WLn−1 to WLn−x, other WL, BTM DMY, IDPDMY deck0, IDPDMY deck1, BSG, and ACS, are identical to their counterparts in FIG. 7C, except for WLn+1. As shown in FIG. 11C, the voltage condition of word line WLn+1 during the channel preparation period is the same as the voltage condition of selected WLn during the channel preparation period, instead of being the same as the voltage condition of other WL during the channel preparation period, in order to further reduce program disturb during the fine programming of the memory cell coupled to selected WLn.

Figure 12A:
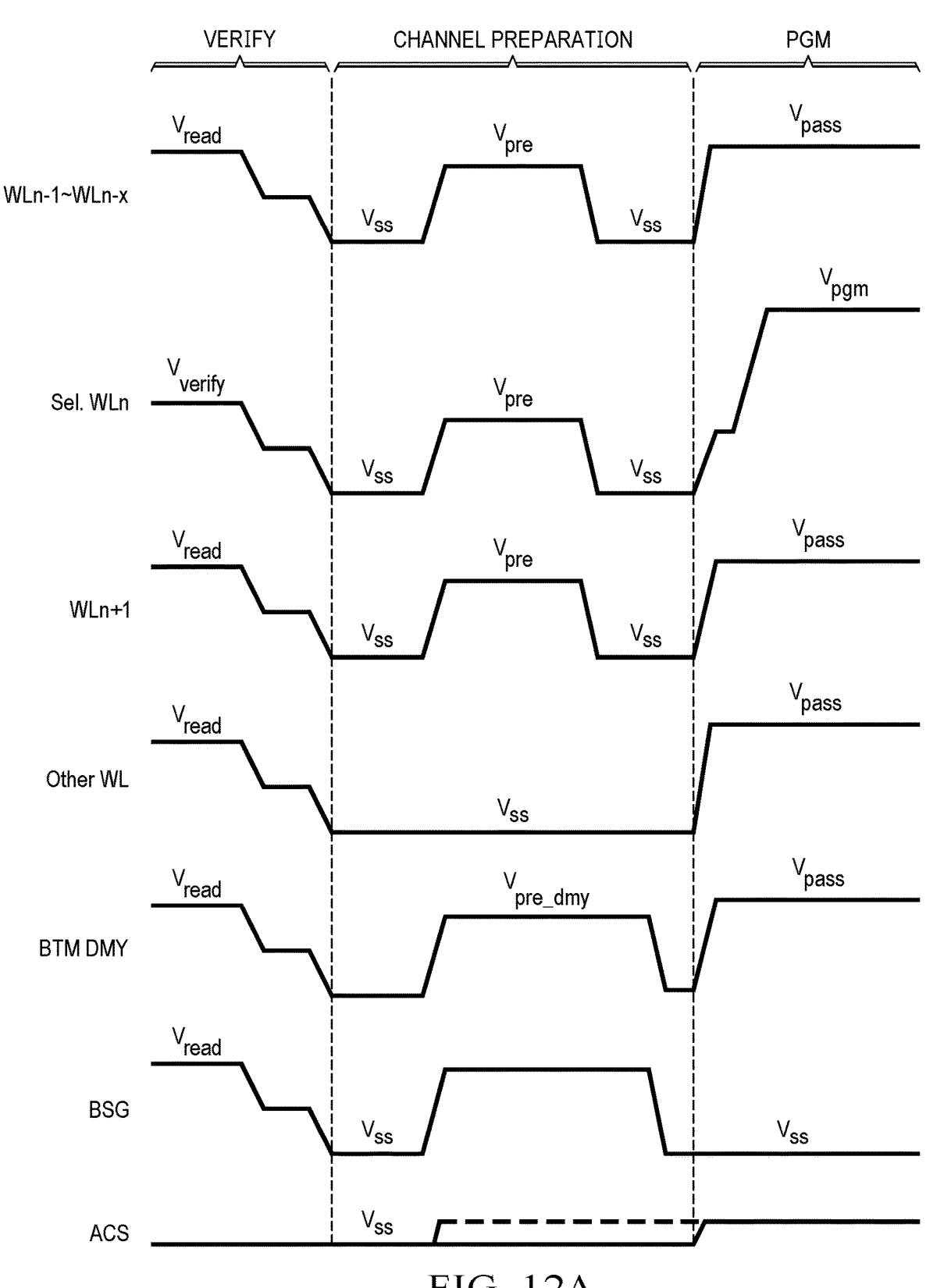
FIG. 12A illustrates an example of voltages of components in the memory cell stack of FIG. 4 during fine programming of a memory cell in deck0 of FIG. 4, according to some aspects of the present disclosure.

FIG. 12A illustrates an example of voltages of components in stack 400 of FIG. 4 during fine programming of a memory cell in deck0 of stack 400, according to some aspects of the present disclosure. Voltage conditions of most of the stack 400 components shown in FIG. 12A, for example, selected WLn, WLn−1 to WLn−x, other WL, BTM DMY, IDPDMY deck0, IDPDMY deck1, BSG, and ACS, are identical to their counterparts in FIG. 9A, except for WLn+1. As shown in FIG. 12A, the voltage condition of word line WLn+1 during the channel preparation period is the same as the voltage condition of selected WLn during the channel preparation period, instead of being the same as the voltage condition of other WL during the channel preparation period, in order to further reduce program disturb during the fine programming of the memory cell coupled to selected WLn.

Figure 12B:
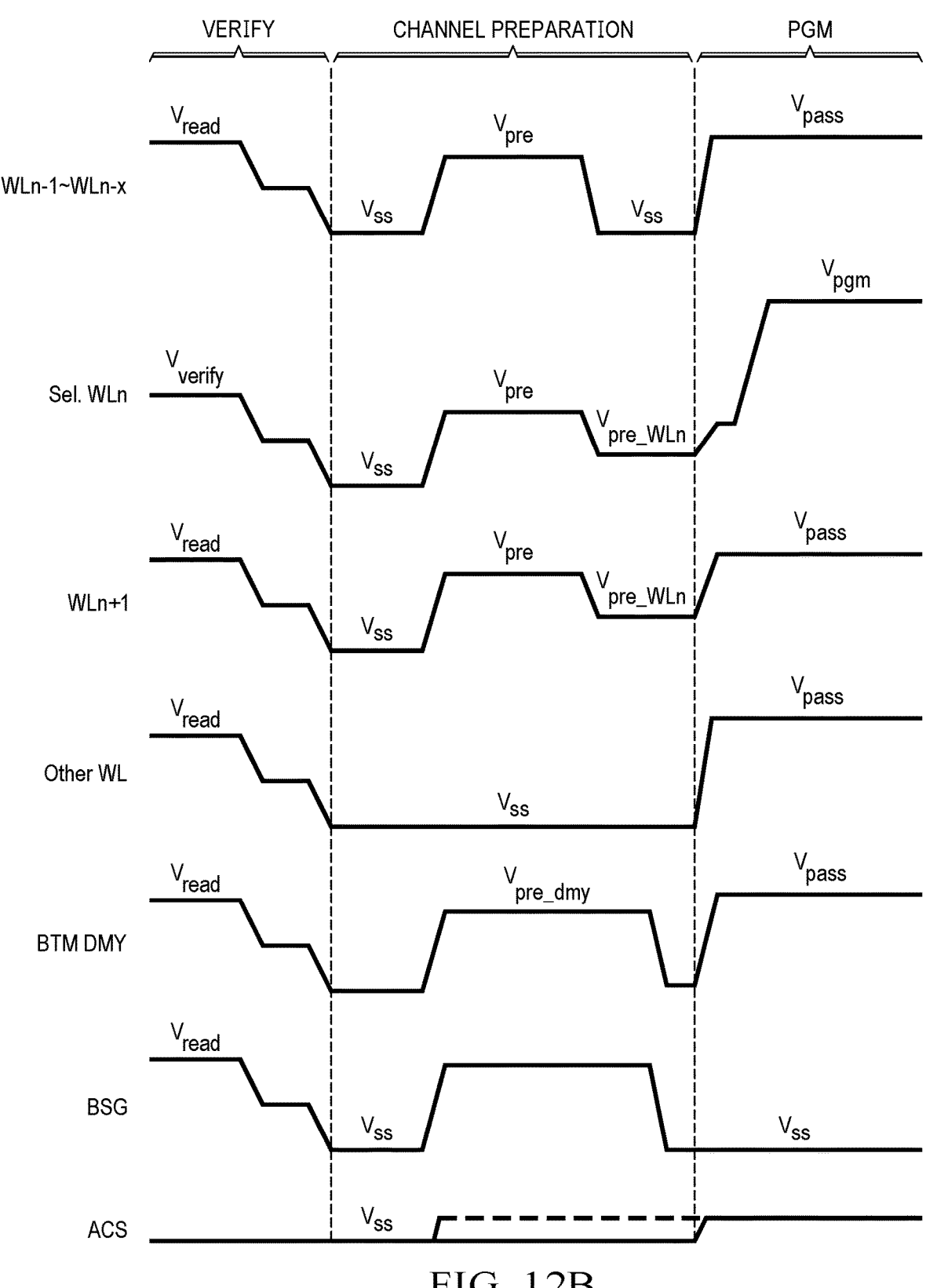
FIG. 12B illustrates another example of voltages of components in the example memory cell stack of FIG. 4 during fine programming of a memory cell in deck0 of FIG. 4, according to some aspects of the present disclosure.

FIG. 12B illustrates another example of voltages of components in stack 400 of FIG. 4 during fine programming of a memory cell in deck2 of FIG. 4, according to some aspects of the present disclosure. Voltage conditions of most of the stack 400 components shown in FIG. 12B, for example, selected WLn, WLn−1 to WLn−x, other WL, BTM DMY, IDPDMY deck0, IDPDMY deck1, BSG, and ACS, are identical to their counterparts in FIG. 9B, except for WLn+1. As shown in FIG. 12B, the voltage condition of word line WLn+1 during the channel preparation period is the same as the voltage condition of selected WLn during the channel preparation period, instead of being the same as the voltage condition of other WL during the channel preparation period, in order to further reduce program disturb during the fine programming of the memory cell coupled to selected WLn.

Figure 12C:
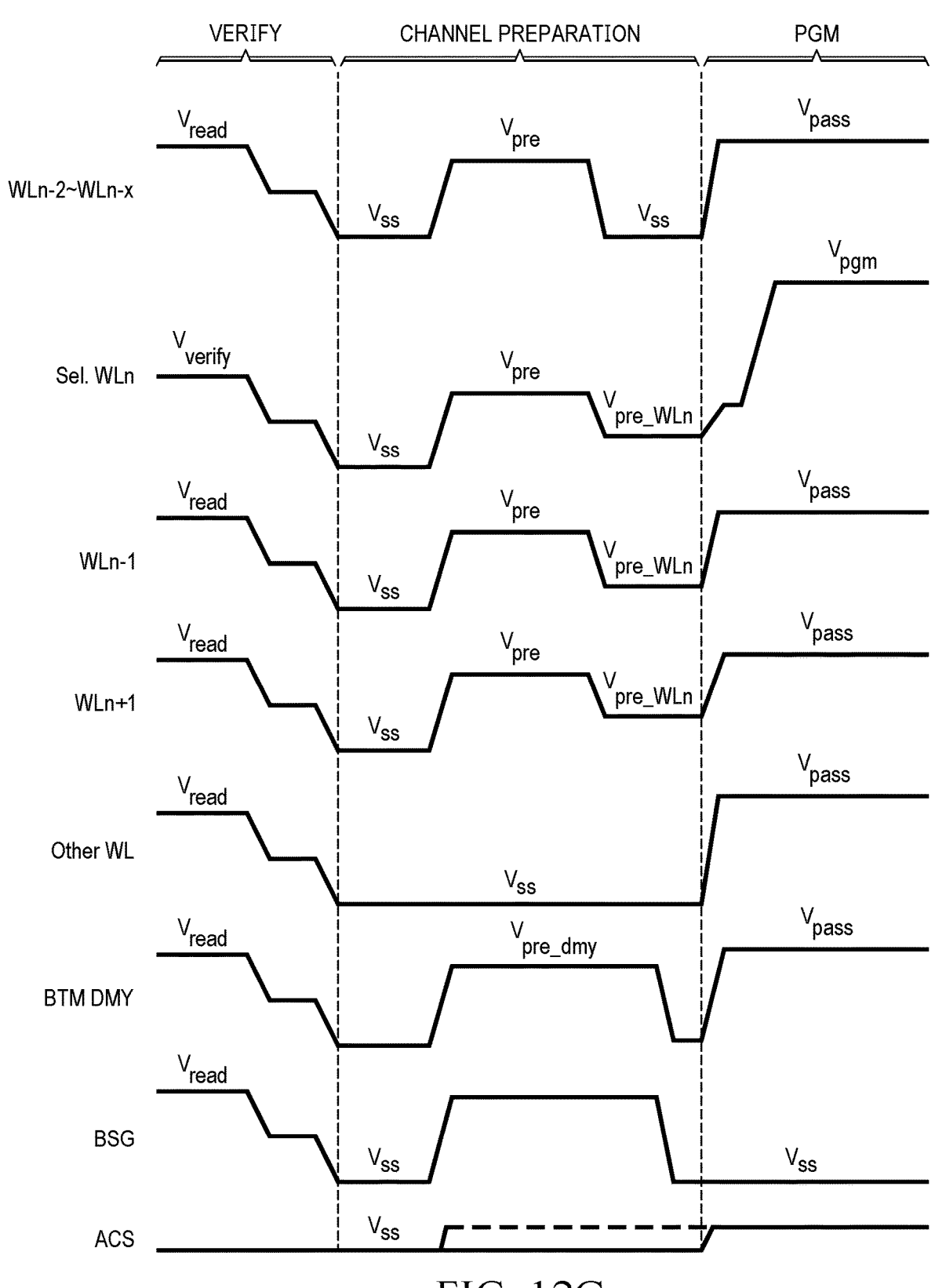
FIG. 12C illustrates another example of voltages of components in the example memory cell stack of FIG. 4 during fine programming of a memory cell in deck0 of FIG. 4, according to some aspects of the present disclosure.

FIG. 12C illustrates another example of voltages of components in stack 400 of FIG. 4 during fine programming of a memory cell in deck2 of FIG. 4, according to some aspects of the present disclosure. Voltage conditions of most of the stack 400 components shown in FIG. 12C, for example, selected WLn, WLn−1 to WLn−x, other WL, BTM DMY, IDPDMY deck0, IDPDMY deck1, BSG, and ACS, are identical to their counterparts in FIG. 9C, except for WLn+1. As shown in FIG. 12C, the voltage condition of word line WLn+1 during the channel preparation period is the same as the voltage condition of selected WLn during the channel preparation period, instead of being the same as the voltage condition of other WL during the channel preparation period, in order to further reduce program disturb during the fine programming of the memory cell coupled to selected WLn.

As described above, FIGS. 5A to 5C, 7A to 7C, and 9A to 12C illustrate voltage conditions of components of stack 400 in FIG. 4, when memory cells in stack 400 are programmed from the top to the bottom of stack 400. When memory cells in stack 400 are programmed from the bottom to the top of stack 400, voltage conditions of components of stack 400 can also be illustrated similarly to those in FIGS. 5A to 5C, 7A to 7C, and 9A to 12C, with certain exceptions. Referring to FIG. 2, the order of the programming process of memory cells in a memory cell stack from the bottom to the top of the memory cell stack is from the memory cells coupled to the word line close to substrate 202 to the memory cells coupled to the word line further away from substrate 202.

More specifically, when memory cells in stack 400 are programmed from the bottom to the top of stack 400, voltage condition of BSG in each of FIGS. 5A to 5C, 7A to 7C, and 9A to 12C can be applied to TSG of stack 400, voltage condition of ACS in each of FIGS. 5A to 5C, 7A to 7C, and 9A to 12C can be applied to the bit line (BL) of stack 400, and voltage condition of BTM DMY in each of FIGS. 5A to 5C, 7A to 7C, and 9A to 12C can be applied to TOP DMY of stack 400. TSG represents one or more select gate lines, for example, DSG line 113, coupled to one or more select gate transistors, for example, DSG 112 in FIG. 1. BL represents a bit line in stack 400, for example, bit line 116 in FIG. 1. TOP DMY represents the topmost dummy word line in deck2 of stack 400.

Figure 13:
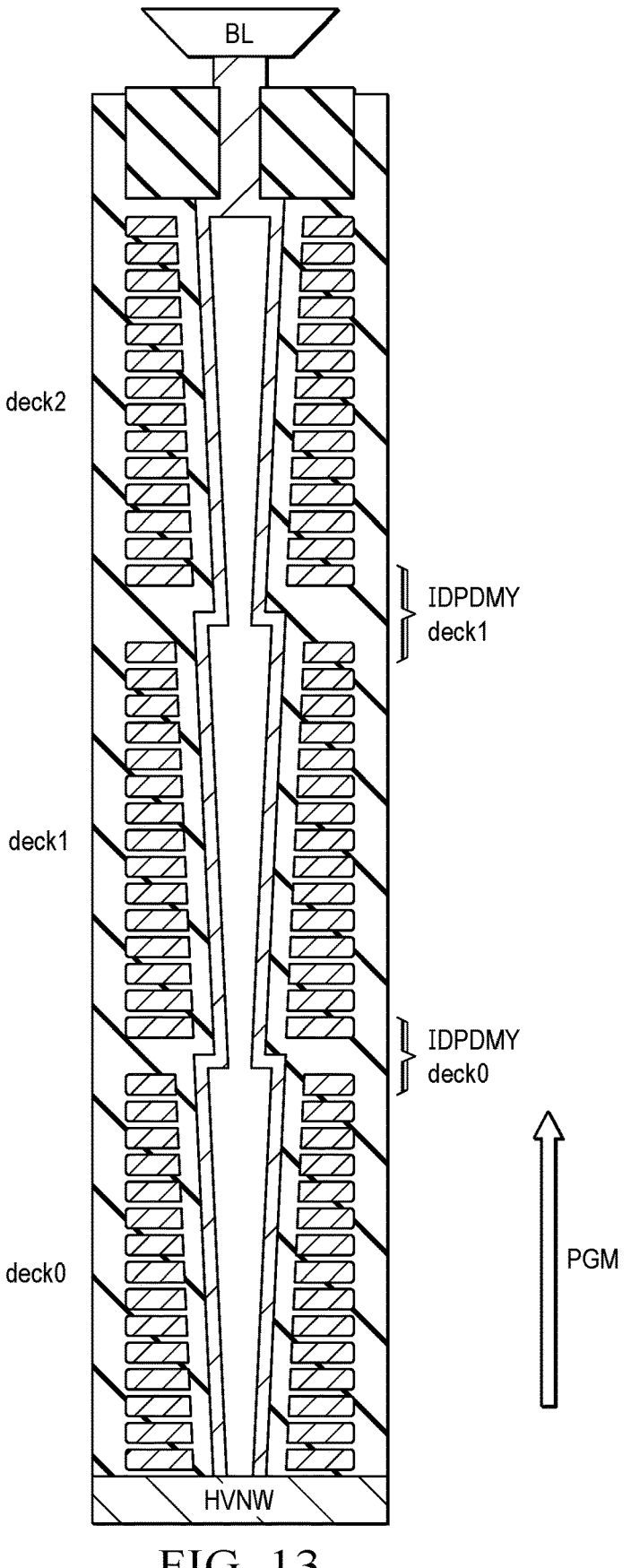
FIG. 13 illustrates the example memory cell stack in FIG. 4, with deck0 having a memory cell selected for programming during a process when memory cells in the memory cell stack are programmed from the bottom to the top of the memory cell stack, according to some aspects of the present disclosure.

For example, FIG. 13 illustrates the example memory cell stack 400 in FIG. 4, with deck0 having a memory cell selected for programming during a process when memory cells in stack 400 are programmed from the bottom to the top of stack 400, according to some aspects of the present disclosure.

Figure 14A:
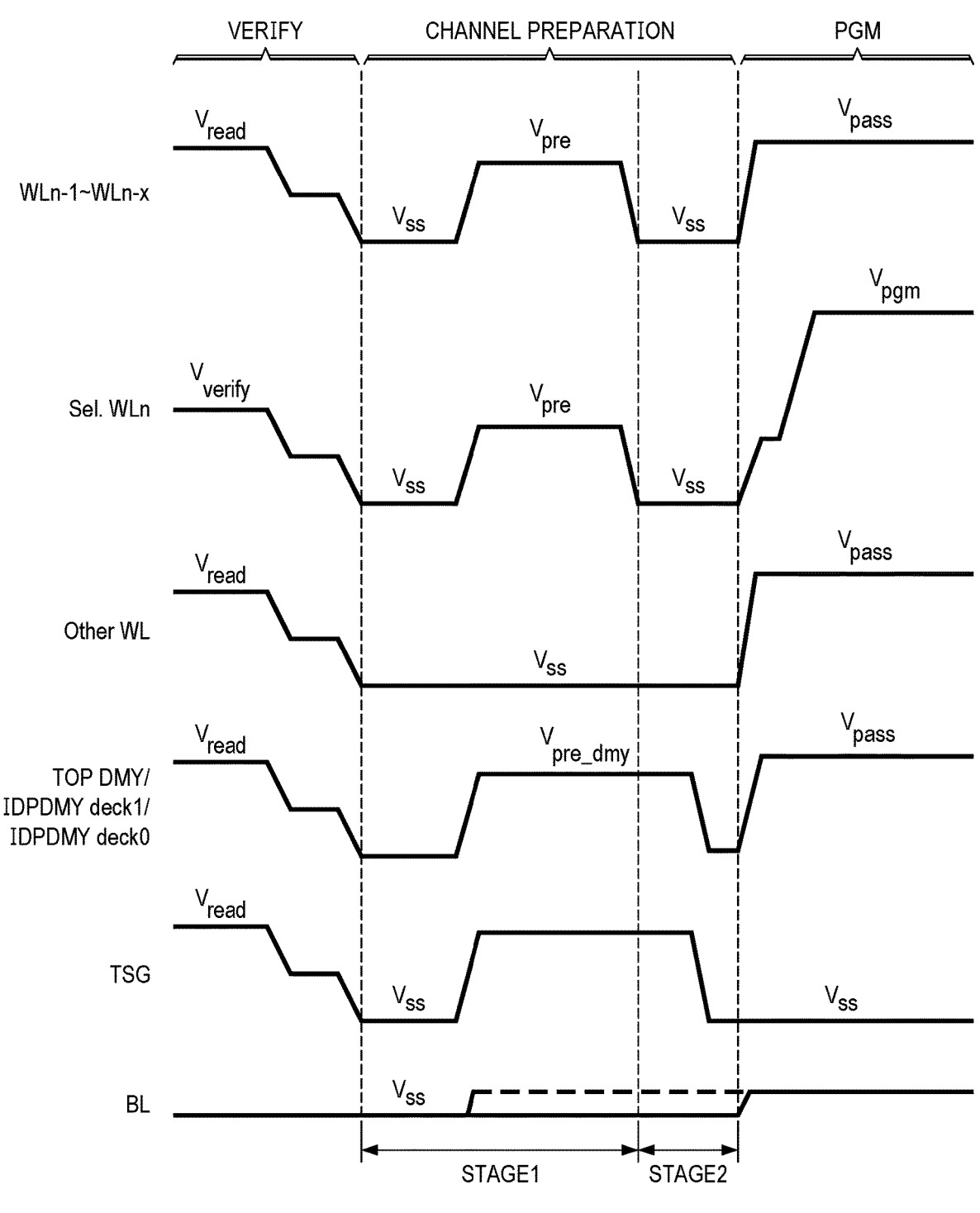
FIG. 14A illustrates an example of voltages of components in the memory cell stack of FIG. 13 during programming of a memory cell in deck0, according to some aspects of the present disclosure.

FIG. 14A illustrates an example of voltages of components in stack 400 of FIG. 13 during programming of a memory cell in deck0, according to some aspects of the present disclosure. Voltage conditions of most components of stack 400 of FIG. 13, for example, selected WLn, WLn−1 to WLn−x, other WL, IDPDMY deck0, and IDPDMY deck1, are identical to their counterparts in FIG. 5A, except for TSG, BL, and TOP DMY. In some implementations, selected WLn represents a word line that is selected for a program operation of a memory cell in deck0. Selected WLn can be an example of word line 118 in FIG. 1. WLn−1 to WLn−x represent word lines coupled to memory cells in deck0 of FIG. 13 that have been programmed during the bottom to top programming of stack 400. Example range of x in WLn−x can be 3 to 10. Each of WLn−1 to WLn−x can also be an example of word line 118 in FIG. 1. For voltage conditions of TSG, BL, and TOP DMY of stack 400 of FIG. 13, because the memory cell in deck0 is selected for programming during the process when memory cells in stack 400 are programmed from the bottom to the top of stack 400, voltage condition of BSG in FIG. 5A can be applied to TSG of stack 400 in FIG. 13, voltage condition of ACS in FIG. 5A can be applied to BL of stack 400 in FIG. 13, and voltage condition of BTM DMY in FIG. 5A can be applied to TOP DMY of stack 400 in FIG. 13.

Figure 14B:
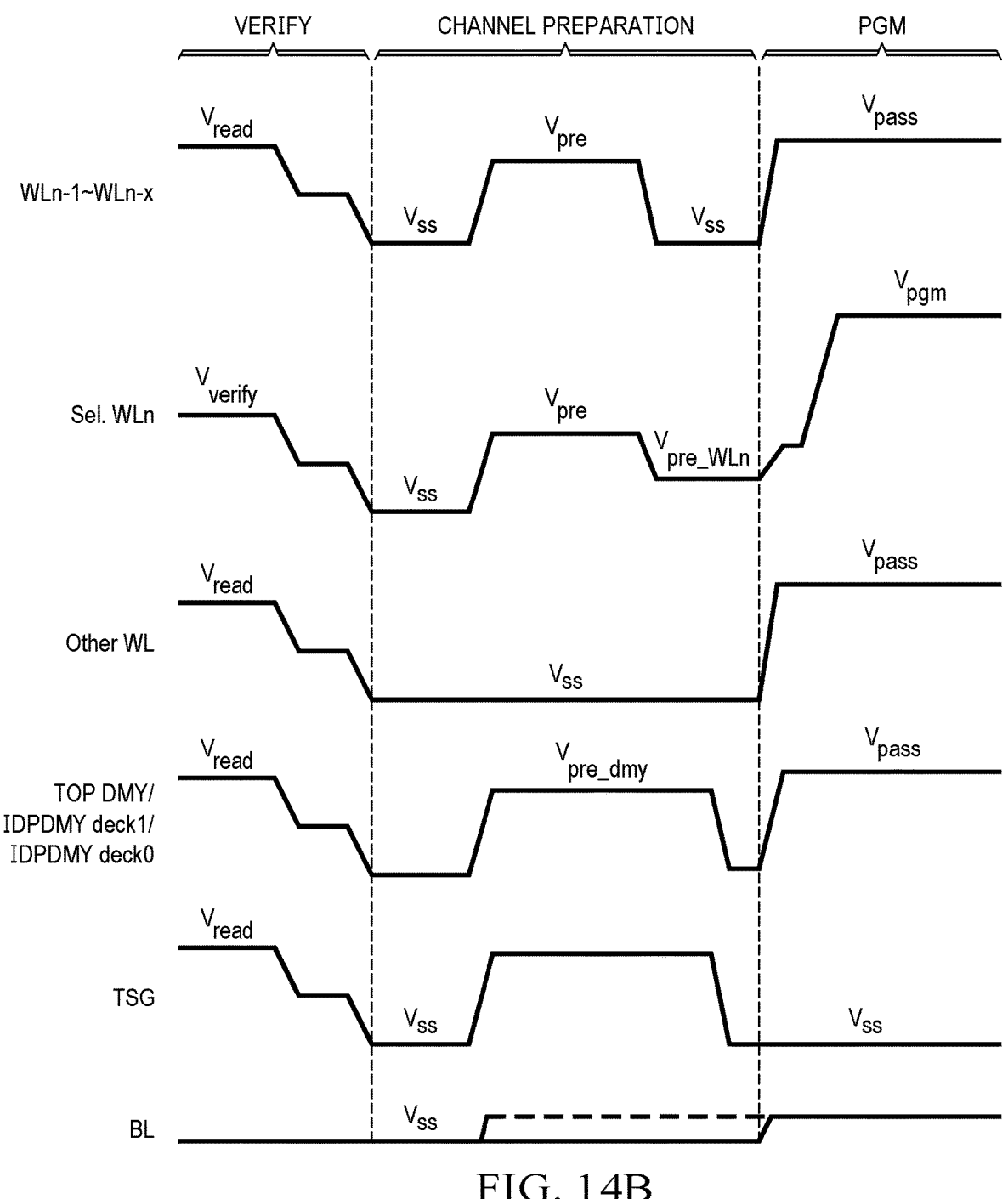
FIG. 14B illustrates another example of voltages of components in the memory cell stack of FIG. 13 during programming of a memory cell in deck0, according to some aspects of the present disclosure.

FIG. 14B illustrates another example of voltages of components in stack 400 of FIG. 13 during programming of a memory cell in deck0, according to some aspects of the present disclosure. Voltage conditions of most components of stack 400 of FIG. 13, for example, selected WLn, WLn−1 to WLn−x, other WL, IDPDMY deck0, and IDPDMY deck1, are identical to their counterparts in FIG. 5B, except for TSG, BL, and TOP DMY. More specifically, because the memory cell in deck0 is selected for programming during the process when memory cells in stack 400 are programmed from the bottom to the top of stack 400, voltage condition of BSG in FIG. 5B can be applied to TSG of stack 400 in FIG. 13, voltage condition of ACS in FIG. 5B can be applied to BL of stack 400 in FIG. 13, and voltage condition of BTM DMY in FIG. 5B can be applied to TOP DMY of stack 400 in FIG. 13.

Figure 14C:
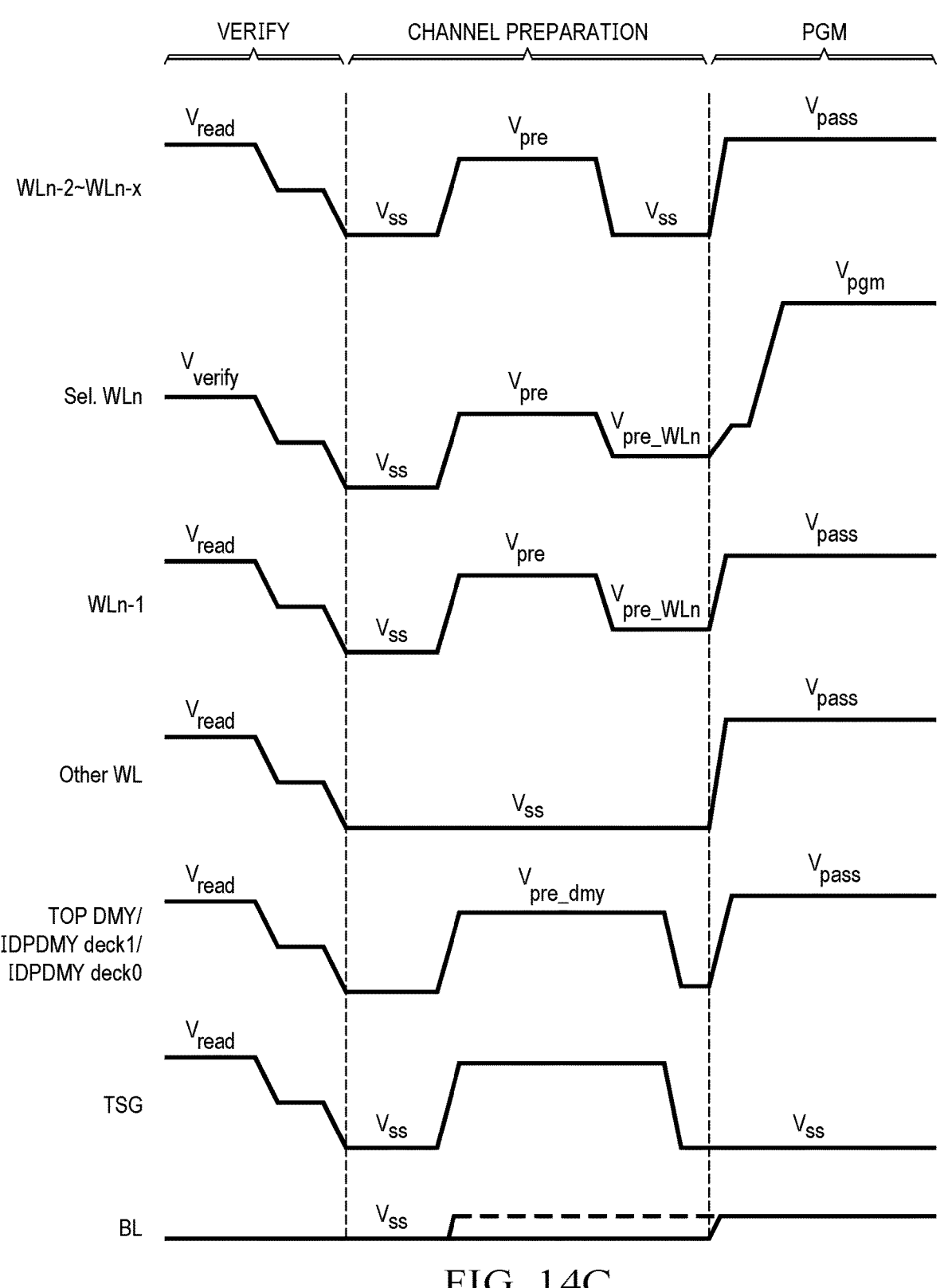
FIG. 14C illustrates another example of voltages of components in the memory cell stack of FIG. 13 during programming of a memory cell in deck0, according to some aspects of the present disclosure.

FIG. 14C illustrates another example of voltages of components in stack 400 of FIG. 13 during programming of a memory cell in deck0, according to some aspects of the present disclosure. Voltage conditions of most components of stack 400 of FIG. 13, for example, selected WLn, WLn−1 to WLn−x, other WL, IDPDMY deck0, and IDPDMY deck1, are identical to their counterparts in FIG. 5C, except for TSG, BL, and TOP DMY. More specifically, because the memory cell in deck0 is selected for programming during the process when memory cells in stack 400 are programmed from the bottom to the top of stack 400, voltage condition of BSG in FIG. 5C can be applied to TSG of stack 400 in FIG. 13, voltage condition of ACS in FIG. 5C can be applied to BL of stack 400 in FIG. 13, and voltage condition of BTM DMY in FIG. 5C can be applied to TOP DMY of stack 400 in FIG. 13.

Figure 15:
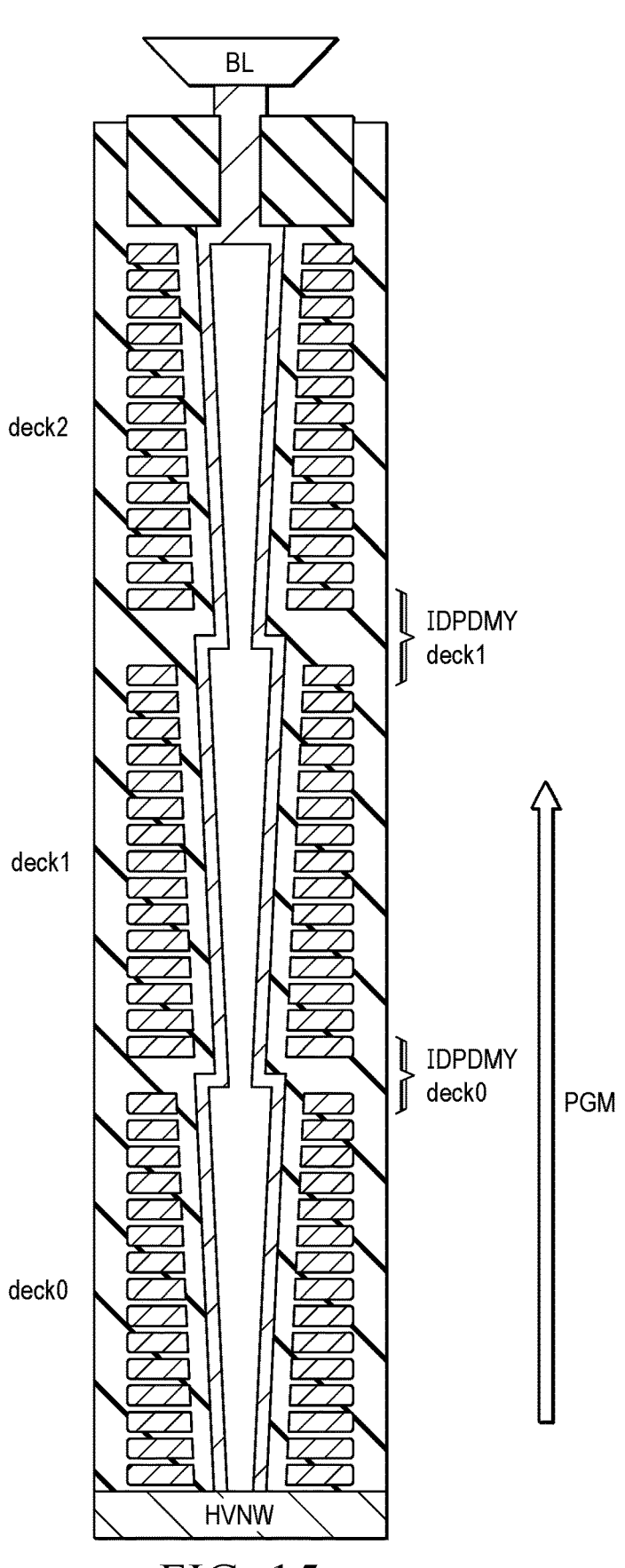
FIG. 15 illustrates the example memory cell stack in FIG. 4, with deck1 having a memory cell selected for programming during a process when memory cells in the example memory cell stack are programmed from the bottom to the top of the memory cell stack, according to some aspects of the present disclosure.

As another example, FIG. 15 illustrates the example memory cell stack 400 in FIG. 4, with deck1 having a memory cell selected for programming during a process when memory cells in stack 400 are programmed from the bottom to the top of stack 400, according to some aspects of the present disclosure.

Figure 16A:
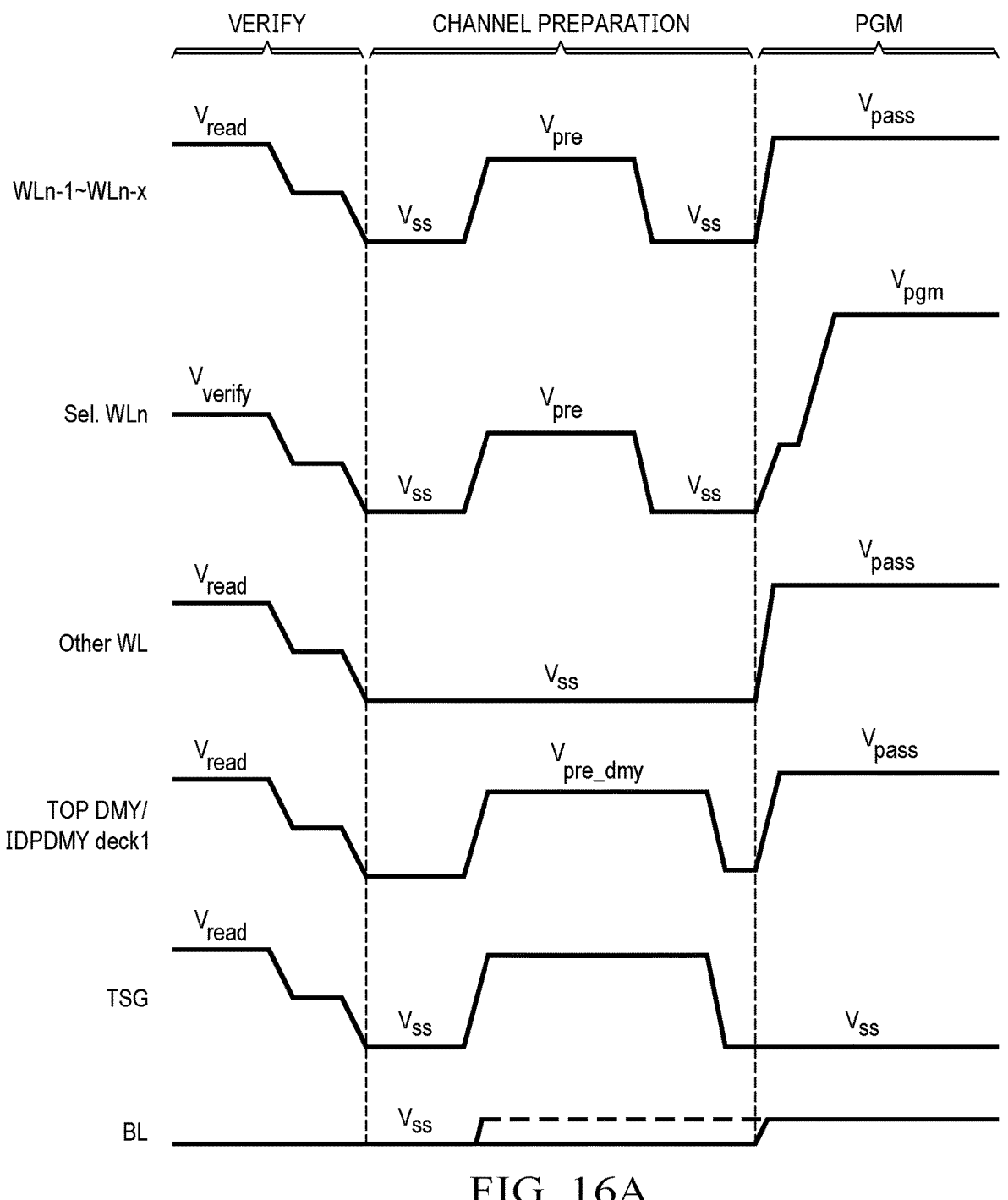
FIG. 16A illustrates an example of voltages of components in the memory cell stack of FIG. 15 during programming of a memory cell in deck1, according to some aspects of the present disclosure.

FIG. 16A illustrates an example of voltages of components in stack 400 of FIG. 15 during programming of a memory cell in deck1, according to some aspects of the present disclosure. Voltage conditions of most components of stack 400 of FIG. 15, for example, selected WLn, WLn−1 to WLn−x, other WL, and IDPDMY deck1, are identical to their counterparts in FIG. 7A, except for TSG, BL, and TOP DMY. More specifically, because the memory cell in deck1 is selected for programming during the process when memory cells in stack 400 are programmed from the bottom to the top of stack 400, voltage condition of BSG in FIG. 7A can be applied to TSG of stack 400 in FIG. 15, voltage condition of ACS in FIG. 7A can be applied to BL of stack 400 in FIG. 15, and voltage condition of BTM DMY in FIG. 7A can be applied to TOP DMY of stack 400 in FIG. 15.

Figure 16B:
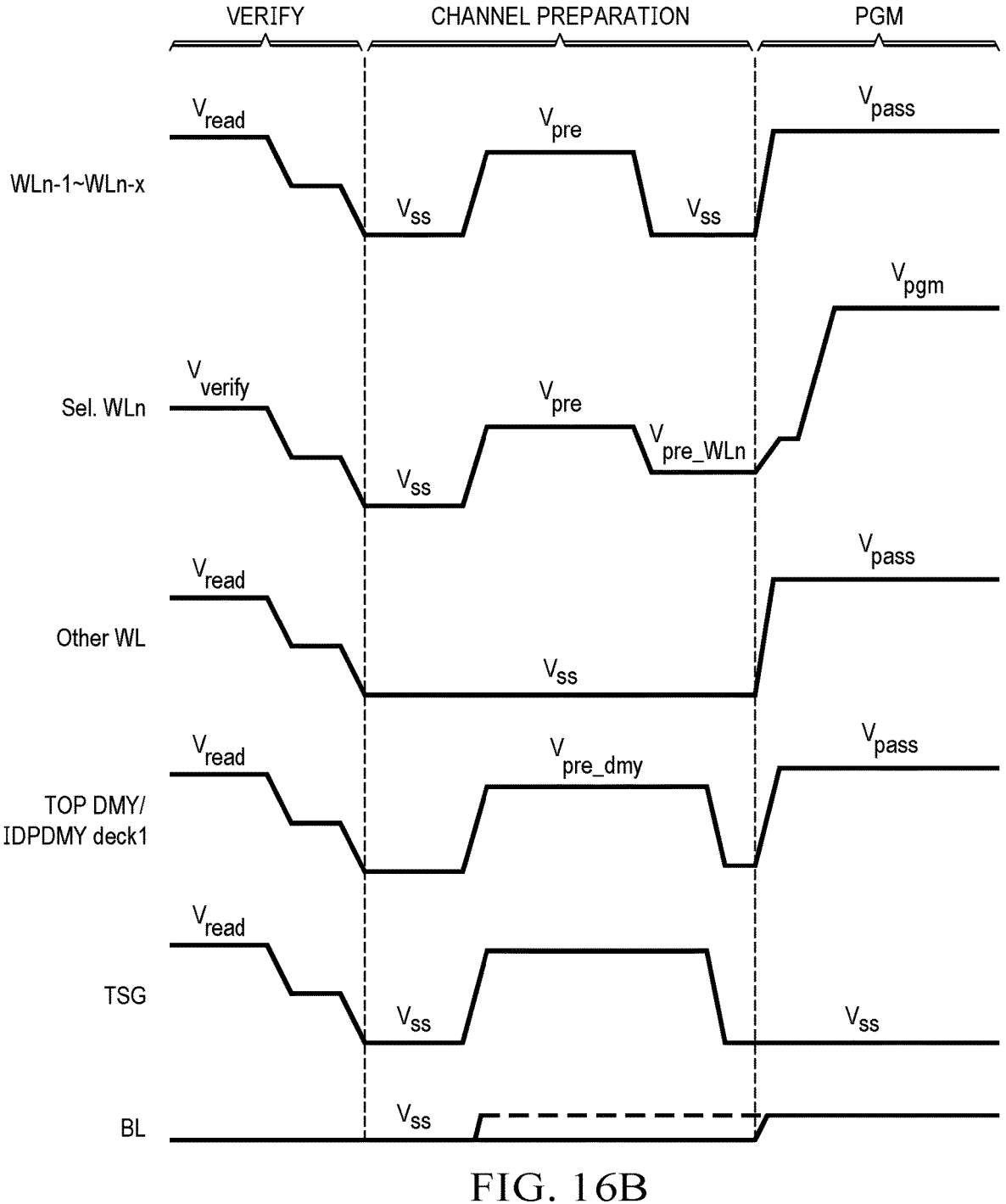
FIG. 16B illustrates another example of voltages of components in the memory cell stack of FIG. 15 during programming of a memory cell in deck1, according to some aspects of the present disclosure.

FIG. 16B illustrates another example of voltages of components in stack 400 of FIG. 15 during programming of a memory cell in deck1, according to some aspects of the present disclosure. Voltage conditions of most components of stack 400 of FIG. 15, for example, selected WLn, WLn−1 to WLn−x, other WL, and IDPDMY deck1, are identical to their counterparts in FIG. 7B, except for TSG, BL, and TOP DMY. More specifically, because the memory cell in deck1 is selected for programming during the process when memory cells in stack 400 are programmed from the bottom to the top of stack 400, voltage condition of BSG in FIG. 7B can be applied to TSG of stack 400 in FIG. 15, voltage condition of ACS in FIG. 7B can be applied to BL of stack 400 in FIG. 15, and voltage condition of BTM DMY in FIG. 7B can be applied to TOP DMY of stack 400 in FIG. 15.

Figure 16C:
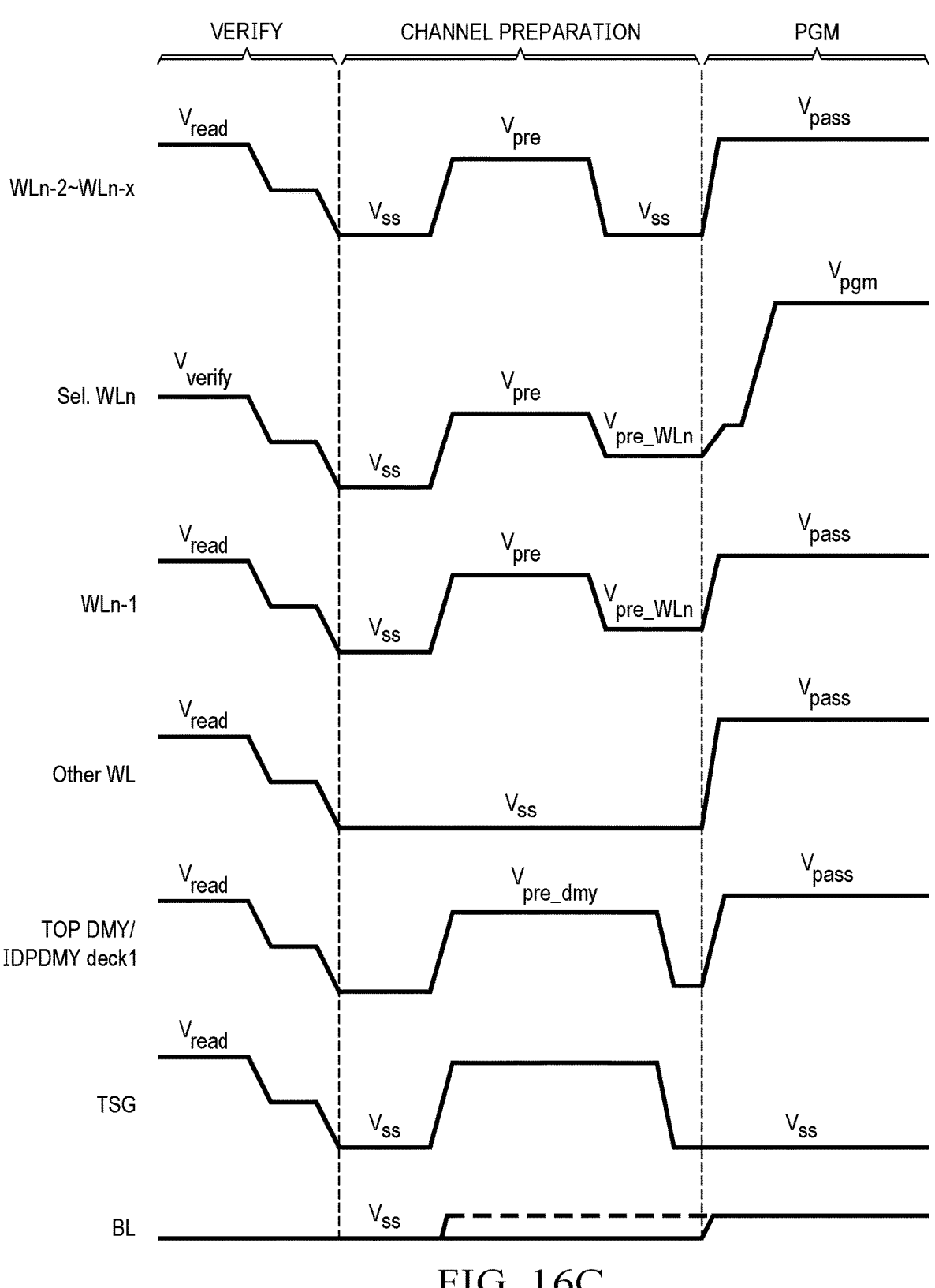
FIG. 16C illustrates another example of voltages of components in the memory cell stack of FIG. 15 during programming of a memory cell in deck1, according to some aspects of the present disclosure.

FIG. 16C illustrates another example of voltages of components in stack 400 of FIG. 15 during programming of a memory cell in deck1, according to some aspects of the present disclosure. Voltage conditions of most components of stack 400 of FIG. 15, for example, selected WLn, WLn−1 to WLn−x, other WL, and IDPDMY deck1, are identical to their counterparts in FIG. 7C, except for TSG, BL, and TOP DMY. More specifically, because the memory cell in deck1 is selected for programming during the process when memory cells in stack 400 are programmed from the bottom to the top of stack 400, voltage condition of BSG in FIG. 7C can be applied to TSG of stack 400 in FIG. 15, voltage condition of ACS in FIG. 7C can be applied to BL of stack 400 in FIG. 15, and voltage condition of BTM DMY in FIG. 7C can be applied to TOP DMY of stack 400 in FIG. 15.

FIG. 17 illustrates an example of a flow chart of a method for reducing program disturb in a memory device, according to some aspects of the present disclosure. At 1702, a peripheral circuit of the memory device applies, at a first time and during a channel preparation period of a program operation of a first memory cell in the memory cell array, a first voltage to a first word line coupled to the first memory cell.

At 1704, the peripheral circuit applies, at a second time after the first time and during the channel preparation period, a second voltage to the first word line, where the second voltage is lower than the first voltage.

At 1706, the peripheral circuit applies a programming voltage to the first word line after the channel preparation period and during the program operation of the first memory cell.

FIG. 18 illustrates a block diagram of an example system 1800 having a memory device, according to some aspects of the present disclosure. System 1800 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 18, system 1800 can include a host 1808 and a memory system 1802 having one or more memory devices 1804 and a memory controller 1806. Host 1808 can be a processor of an electronic device, such as a central processing unit (CPU), or a system-on-chip (SoC), such as an application processor (AP). Host 1808 can be configured to send or receive data to or from memory devices 1804.

Memory device 1804 can be any memory device disclosed in the present disclosure. Memory controller 1806 is coupled to memory device 1804 and host 1808 and is configured to control memory device 1804, according to some implementations. Memory controller 1806 can manage the data stored in memory device 1804 and communicate with host 1808. In some implementations, memory controller 1806 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 1806 is designed for operating in a high duty-cycle environment SSDs or embedded multi-media-cards (eMMCs) used as data storage for mobile devices, such as smartphones, tablets, laptop computers, etc., and enterprise storage arrays. Memory controller 1806 can be configured to control operations of memory device 1804, such as read, erase, and program operations. Memory controller 1806 can also be configured to manage various functions with respect to the data stored or to be stored in memory device 1804 including, but not limited to bad-block management, garbage collection, logical-to-physical address conversion, wear leveling, etc. In some implementations, memory controller 1806 is further configured to process error correction codes (ECCs) with respect to the data read from or written to memory device 1804. Any other suitable functions may be performed by memory controller 1806 as well, for example, formatting memory device 1804.

Memory controller 1806 can communicate with an external device (e.g., host 1808) according to a particular communication protocol. For example, memory controller 1806 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 19A:
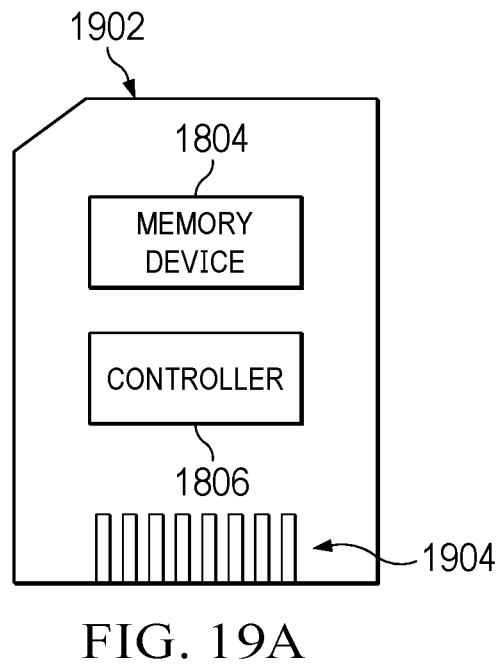
FIG. 19A illustrates a diagram of a memory card having a memory device, according to some aspects of the present disclosure.
Figure 19B:
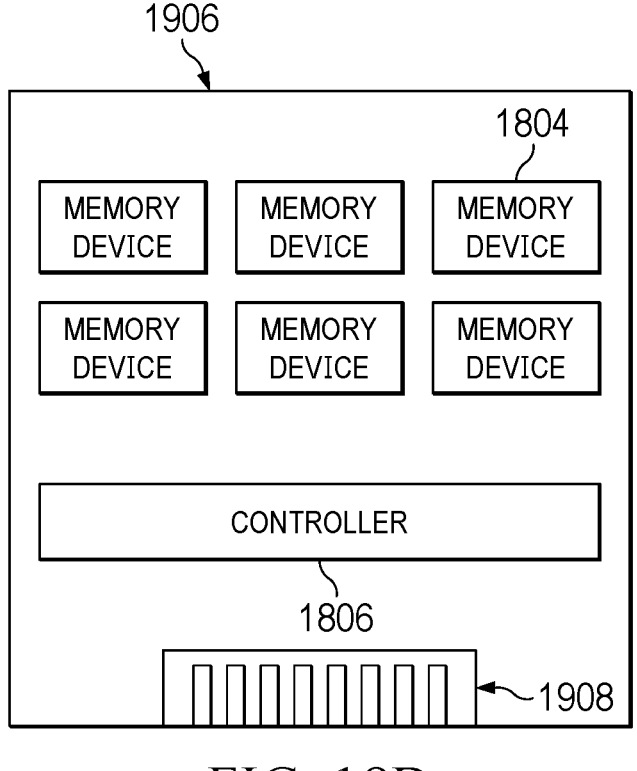
FIG. 19B illustrates a diagram of a solid-state drive (SSD) having a memory device, according to some aspects of the present disclosure.

Memory controller 1806 and one or more memory devices 1804 can be integrated into various types of storage devices, for example, be included in the same package, such as a universal Flash storage (UFS) package or an eMMC package. That is, memory system 1802 can be implemented and packaged into different types of end electronic products. In one example shown in FIG. 19A, memory controller 1806 and a single memory device 1804 may be integrated into a memory card 1902. Memory card 1902 can include a PC card (PCMCIA, personal computer memory card international association), a CF card, a smart media (SM) card, a memory stick, a multimedia card (MMC, RS-MMC, MMC-micro), an SD card (SD, miniSD, microSD, SDHC), a UFS, etc. Memory card 1902 can further include a memory card connector 1904 coupling memory card 1902 with a host (e.g., host 1808 in FIG. 18). In another example shown in FIG. 19B, memory controller 1806 and multiple memory devices 1804 may be integrated into an SSD 1906. SSD 1906 can further include an SSD connector 1908 coupling SSD 1906 with a host (e.g., host 1808 in FIG. 18). In some implementations, the storage capacity and/or the operation speed of SSD 1906 is greater than those of memory card 1902.

Certain aspects of the subject matter described here can be implemented as a memory device. The memory device includes a memory cell array and a peripheral circuit. The memory cell array includes memory cells. The peripheral circuit is coupled to the memory cell array and configured to perform operations, where to perform the operations, the peripheral circuit is configured to apply, at a first time and during a channel preparation period of a program operation of a first memory cell in the memory cell array, a first voltage to a first word line coupled to the first memory cell, apply, at a second time after the first time and during the channel preparation period, a second voltage to the first word line, where the second voltage is lower than the first voltage, and apply a programming voltage to the first word line after the channel preparation period and during the program operation of the first memory cell.

The memory device can include one or more of the following features.

In some implementations, the first voltage is lower than the programming voltage.

In some implementations, the peripheral circuit is further configured to apply a third voltage to the first word line before the first time, where the third voltage is lower than the first voltage.

In some implementations, the third voltage is lower than or equal to the second voltage.

In some implementations, the peripheral circuit is further configured to apply, at the first time, the first voltage to a second word line coupled to one or more memory cells in the memory cell array, where each of the one or more memory cells is a programmed memory cell, and apply, at the second time, a fourth voltage to the second word line.

In some implementations, the first voltage is lower than a pass voltage to be applied to the second word line after the second time.

In some implementations, the fourth voltage is lower than or equal to the second voltage.

In some implementations, the peripheral circuit is further configured to apply a fifth voltage to a third word line before applying a pass voltage to the third word line, where the third word line is coupled to one or more memory cells in the memory cell array, and each of the one or more memory cells is an unprogrammed memory cell.

In some implementations, the fifth voltage is lower than the pass voltage.

In some implementations, the peripheral circuit is further configured to apply, at the first time, a sixth voltage to a fourth word line coupled to a memory cell adjacent to a select gate transistor, where the select gate transistor is coupled to a source line of the memory cell array, the sixth voltage is higher than the third voltage, and the fourth word line is a first dummy word line, and apply, at a third time after the second time, the third voltage to the fourth word line.

In some implementations, the peripheral circuit is further configured to apply, at the first time, a seventh voltage to a select gate line coupled to the select gate transistor, where the seventh voltage is higher than the third voltage, and apply, at the third time, the third voltage to the select gate line.

In some implementations, the peripheral circuit is further configured to apply, at the first time, an eighth voltage to the source line of the memory cell array.

In some implementations, the eighth voltage is equal to the third voltage.

In some implementations, the memory cell array includes a first deck of memory cells and a second deck of memory cells, the first deck is adjacent to the second deck, the first memory cell is in the first deck, and the peripheral circuit is further configured to apply, at the first time, the sixth voltage to a fifth word line coupled to a memory cell in the first deck that is closest to the second deck, where the fifth word line is a second dummy word line.

In some implementations, the peripheral circuit is further configured to apply, at the first time, the sixth voltage to a sixth word line coupled to a memory cell in the second deck that is closest to the first deck, where the sixth word line is a third dummy word line.

In some implementations, the first memory cell is a multi-level cell, and the program operation of the first memory cell is a coarse program operation.

In some implementations, the first memory cell is a multi-level cell, the program operation of the first memory cell is a fine program operation, and the peripheral circuit is further configured to apply, at the first time, the first voltage to a seventh word line coupled to a second memory cell in the memory cell array, where the seventh word line is adjacent to the first word line, and apply, at the second time, the second voltage to the seventh word line.

Certain aspects of the subject matter described here can be implemented as a memory system. The memory system includes a memory device and a controller. The memory device includes a memory cell array and a peripheral circuit. The memory cell array includes memory cells. The peripheral circuit is coupled to the memory cell array and configured to perform operations, where to perform the operations, the peripheral circuit is configured to apply, at a first time and during a channel preparation period of a program operation of a first memory cell in the memory cell array, a first voltage to a first word line coupled to the first memory cell, apply, at a second time after the first time and during the channel preparation period, a second voltage to the first word line, where the second voltage is lower than the first voltage, and apply a programming voltage to the first word line after the channel preparation period and during the program operation of the first memory cell.

Certain aspects of the subject matter described here can be implemented as a method. The method includes applying, at a first time and during a channel preparation period of a program operation of a first memory cell in a memory cell array, a first voltage to a first word line coupled to the first memory cell, applying, at a second time after the first time and during the channel preparation period, a second voltage to the first word line, where the second voltage is lower than the first voltage, and applying a programming voltage to the first word line after the channel preparation period and during the program operation of the first memory cell.

The method can include one or more of the following features.

In some implementations, the first voltage is lower than the programming voltage.

In some implementations, the method further includes applying a third voltage to the first word line before the first time, where the third voltage is lower than the first voltage.

In some implementations, the third voltage is lower than or equal to the second voltage.

In some implementations, the method further includes applying, at the first time, the first voltage to a second word line coupled to one or more memory cells in the memory cell array, where each of the one or more memory cells is a programmed memory cell, and applying, at the second time, a fourth voltage to the second word line.

In some implementations, the first voltage is lower than a pass voltage to be applied to the second word line after the second time.

In some implementations, the fourth voltage is lower than or equal to the second voltage.

In some implementations, the method further includes applying, at the first time, a sixth voltage to a fourth word line coupled to a memory cell adjacent to a select gate transistor, where the select gate transistor is coupled to a source line of the memory cell array, the sixth voltage is higher than the third voltage, and the fourth word line is a first dummy word line, and applying, at a third time after the second time, the third voltage to the fourth word line.

In some implementations, the memory cell array includes a first deck of memory cells and a second deck of memory cells, the first deck is adjacent to the second deck, the first memory cell is in the first deck, and the method further includes applying, at the first time, the sixth voltage to a fifth word line coupled to a memory cell in the first deck that is closest to the second deck, where the fifth word line is a second dummy word line.

In some implementations, the method further includes applying, at the first time, the sixth voltage to a sixth word line coupled to a memory cell in the second deck that is closest to the first deck, where the sixth word line is a third dummy word line.

In some implementations, the first memory cell is a multi-level cell, and the program operation of the first memory cell is a coarse program operation.

In some implementations, the first memory cell is a multi-level cell, the program operation of the first memory cell is a fine program operation, and the method further includes applying, at the first time, the first voltage to a seventh word line coupled to a second memory cell in the memory cell array, where the seventh word line is adjacent to the first word line, and applying, at the second time, the second voltage to the seventh word line.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any subcombination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

As used in this disclosure, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, the phraseology or terminology employed in this disclosure, and not otherwise defined, is for the purpose of description only and not of limitation. Any use of section headings is intended to aid reading of the document and is not to be interpreted as limiting; information that is relevant to a section heading may occur within or outside of that particular section.

As used in this disclosure, the term "about" or "approximately" can allow for a degree of variability in a value or range, for example, within 10%, within 5%, or within 1% of a stated value or of a stated limit of a range.

As used in this disclosure, the term "substantially" refers to a majority of, or mostly, as in at least about 50%, 60%, 70%, 80%, 90%, 95%, 96%, 97%, 98%, 99%, 99.5%, 99.9%, 99.99%, or at least about 99.999% or more.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "0.1% to about 5%" or "0.1% to 5%" should be interpreted to include about 0.1% to about 5%, as well as the individual values (for example, 1%, 2%, 3%, and 4%) and the sub-ranges (for example, 0.1% to 0.5%, 1.1% to 2.2%, 3.3% to 4.4%) within the indicated range. The statement "X to Y" has the same meaning as "about X to about Y," unless indicated otherwise. Likewise, the statement "X, Y, or Z" has the same meaning as "about X, about Y, or about Z," unless indicated otherwise.

Particular implementations of the subject matter have been described. Other implementations, alterations, and permutations of the described implementations are within the scope of the following claims as will be apparent to those skilled in the art. While operations are depicted in the drawings or claims in a particular order, such operations are not required be performed in the particular order shown or in sequential order, or that all illustrated operations be performed (some operations may be considered optional), to achieve desirable results. In certain circumstances, multi-tasking or parallel processing (or a combination of multi-tasking and parallel processing) may be advantageous and performed as deemed appropriate.

Moreover, the separation or integration of various system modules and components in the previously described implementations are not required in all implementations, and the described components and systems can generally be integrated together or packaged into multiple products.

Accordingly, the previously described example implementations do not define or constrain the present disclosure. Other changes, substitutions, and alterations are also possible without departing from the spirit and scope of the present disclosure.

What is claimed is:

1. A memory device, comprising:
a memory cell array comprising memory cells; and
a peripheral circuit coupled to the memory cell array and configured to perform operations comprising:
applying, at a first time and during a channel preparation period of a program operation of a first memory cell in the memory cell array, a first voltage to a first word line coupled to the first memory cell;
applying, at a second time after the first time and during the channel preparation period, a second voltage to the first word line, wherein the second voltage is lower than the first voltage;
applying a third voltage to the first word line before the first time, wherein the third voltage is lower than the first voltage;
applying, at the first time, an eighth voltage to a source line of the memory cell array, wherein the eighth voltage is equal to the third voltage; and
applying a programming voltage to the first word line after the channel preparation period and during the program operation of the first memory cell.

2. The memory device according to claim 1, wherein the first voltage is lower than the programming voltage.

3. The memory device according to claim 1, wherein the third voltage is lower than or equal to the second voltage.

4. The memory device according to claim 1, wherein the operations further comprise:
applying, at the first time, the first voltage to a second word line coupled to one or more memory cells in the memory cell array, wherein each of the one or more memory cells is a programmed memory cell; and
applying, at the second time, a fourth voltage to the second word line.

5. The memory device according to claim 4, wherein the first voltage is lower than a pass voltage to be applied to the second word line after the second time.

6. The memory device according to claim 4, wherein the fourth voltage is lower than or equal to the second voltage.

7. The memory device according to claim 1, wherein the operations further comprise:
applying a fifth voltage to a third word line before applying a pass voltage to the third word line, wherein the third word line is coupled to one or more memory cells in the memory cell array, and each of the one or more memory cells is an unprogrammed memory cell.

8. The memory device according to claim 7, wherein the fifth voltage is lower than the pass voltage.

9. The memory device according to claim 1, wherein the operations further comprise:
applying, at the first time, a sixth voltage to a fourth word line coupled to a memory cell adjacent to a select gate transistor, wherein the select gate transistor is coupled to a source line of the memory cell array, the sixth voltage is higher than the third voltage, and the fourth word line is a first dummy word line; and
applying, at a third time after the second time, the third voltage to the fourth word line.

10. The memory device according to claim 9, wherein the operations further comprise:
applying, at the first time, a seventh voltage to a select gate line coupled to the select gate transistor, wherein the seventh voltage is higher than the third voltage; and
applying, at the third time, the third voltage to the select gate line.

11. The memory device according to claim 9, wherein the memory cell array comprises a first deck of memory cells and a second deck of memory cells, the first deck is adjacent to the second deck, the first memory cell is in the first deck, and the operations further comprise:
applying, at the first time, the sixth voltage to a fifth word line coupled to a memory cell in the first deck that is closest to the second deck, wherein the fifth word line is a second dummy word line.

12. The memory device according to claim 11, wherein the operations further comprise:
applying, at the first time, the sixth voltage to a sixth word line coupled to a memory cell in the second deck that is closest to the first deck, wherein the sixth word line is a third dummy word line.

13. The memory device according to claim 1, wherein the first memory cell is a multi-level cell, and the program operation of the first memory cell is a coarse program operation.

14. The memory device according to claim 1, wherein the first memory cell is a multi-level cell, the program operation of the first memory cell is a fine program operation, and the operations further comprise:
applying, at the first time, the first voltage to a seventh word line coupled to a second memory cell in the memory cell array, wherein the seventh word line is adjacent to the first word line; and applying, at the second time, the second voltage to the seventh word line.

15. A memory system, comprising:

a memory device, comprising:

a memory cell array comprising memory cells; and a peripheral circuit coupled to the memory cell array and configured to perform operations comprising:

applying, at a first time and during a channel preparation period of a program operation of a first memory cell in the memory cell array, a first voltage to a first word line coupled to the first memory cell;

applying, at a second time after the first time and during the channel preparation period, a second voltage to the first word line, wherein the second voltage is lower than the first voltage;

applying a third voltage to the first word line before the first time, wherein the third voltage is lower than the first voltage;

applying, at the first time, an eighth voltage to a source line of the memory cell array, wherein the eighth voltage is equal to the third voltage; and applying a programming voltage to the first word line after the channel preparation period and during the program operation of the first memory cell; and a controller coupled to the memory device and configured to send a signal to the memory device to initiate the program operation.

16. A method, comprising:

applying, at a first time and during a channel preparation period of a program operation of a first memory cell in a memory cell array, a first voltage to a first word line coupled to the first memory cell;

applying, at a second time after the first time and during the channel preparation period, a second voltage to the first word line, wherein the second voltage is lower than the first voltage;

applying a third voltage to the first word line before the first time, wherein the third voltage is lower than the first voltage;

applying, at the first time, an eighth voltage to a source line of the memory cell array, wherein the eighth voltage is equal to the third voltage; and applying a programming voltage to the first word line after the channel preparation period and during the program operation of the first memory cell.

17. The memory system according to claim 15, wherein the third voltage is lower than or equal to the second voltage.

18. The memory system according to claim 15, wherein the operations further comprise:

applying, at the first time, the first voltage to a second word line coupled to one or more memory cells in the memory cell array, wherein each of the one or more memory cells is a programmed memory cell; and applying, at the second time, a fourth voltage to the second word line.

19. The method according to claim 16, wherein the third voltage is lower than or equal to the second voltage.

20. The method according to claim 16, wherein the method further comprises:

applying, at the first time, the first voltage to a second word line coupled to one or more memory cells in the memory cell array, wherein each of the one or more memory cells is a programmed memory cell; and applying, at the second time, a fourth voltage to the second word line.

\* \* \* \* \*